United States Patent
Meynants

(10) Patent No.: US 9,231,005 B2
(45) Date of Patent: Jan. 5, 2016

(54) PIXEL ARRAY

(71) Applicant: Guy Meynants, Retie (BE)

(72) Inventor: Guy Meynants, Retie (BE)

(73) Assignee: CMOSIS BVBA, Antwerp (BE)

( * ) Notice: Subject to any disclaimer, the term of this patent is extended or adjusted under 35 U.S.C. 154(b) by 235 days.

(21) Appl. No.: 14/091,335

(22) Filed: Nov. 26, 2013

(65) Prior Publication Data

US 2014/0145068 A1    May 29, 2014

(30) Foreign Application Priority Data

Nov. 29, 2012 (GB) .................................. 1221516.6

(51) Int. Cl.
| | |
|---|---|
| H01L 27/00 | (2006.01) |
| H01L 27/146 | (2006.01) |
| H04N 5/232 | (2006.01) |
| H04N 5/369 | (2011.01) |
| H04N 5/225 | (2006.01) |

(52) U.S. Cl.
CPC .... *H01L 27/14605* (2013.01); *H01L 27/14643* (2013.01); *H04N 5/2254* (2013.01); *H04N 5/23212* (2013.01); *H04N 5/3696* (2013.01)

(58) Field of Classification Search
CPC . H04N 5/23212; H04N 5/3696; H04N 5/378; H01L 27/14605; H01L 27/14623; H01L 27/14625; H01L 27/14643
USPC ............... 250/208.1, 214.1; 257/231, 443; 348/345, 349, 326
See application file for complete search history.

(56) References Cited

U.S. PATENT DOCUMENTS

| | | |
|---|---|---|
| 6,819,360 B1 | 11/2004 | Ide et al. |
| 8,098,321 B2 | 1/2012 | Shimoda et al. |
| 9,136,294 B1 * | 9/2015 | Pyeoun ............... H01L 27/1462 |
| 2002/0036257 A1 | 3/2002 | Yamashita et al. |
| 2007/0154200 A1 | 7/2007 | Utagawa |
| 2008/0291311 A1 | 11/2008 | Kusaka |
| 2009/0290059 A1 | 11/2009 | Suzuki |
| 2009/0295954 A1 | 12/2009 | Mori et al. |
| 2010/0148037 A1 | 6/2010 | Bogaerts et al. |

FOREIGN PATENT DOCUMENTS

| | | |
|---|---|---|
| EP | 1185089 A2 | 3/2002 |
| EP | 2330449 A1 | 6/2011 |
| EP | 2346079 B1 | 11/2013 |
| JP | 2007233035 A | 9/2007 |
| JP | 2007281296 A | 10/2007 |
| JP | 2011250325 A | 12/2011 |
| WO | 2010101096 A1 | 9/2010 |
| WO | 2011055617 A1 | 5/2013 |

* cited by examiner

*Primary Examiner* — Kevin Pyo
(74) *Attorney, Agent, or Firm* — Sulzer Green Taylor PLLC

(57) ABSTRACT

A pixel array for imaging comprises an array of pixels of a first pixel type and a second pixel type. Each pixel of the first pixel type comprises a first photo-sensitive element having a first area. Each pixel of the second pixel type comprises a second photo-sensitive element and a third photo-sensitive element. The second photo-sensitive element has a second area, which is smaller than the first area. Only the second photo-sensitive element in the pixel of the second pixel type is connected to a readout circuit. The third photo-sensitive element is connected to a charge drain via a permanent connection or a switchable connection. Outputs of the second photo-sensitive elements can be used to perform phase detect autofocussing.

19 Claims, 26 Drawing Sheets

(i)                        (ii)

(i) Standard pixel layout (ii) AF pixel layout : 2 TX gates (iii) AF pixel layout: separate readout L/R Operation for movie mode autofocus adjust AF pixel layout with 4 photodiodes in the pixel Figure 25 Timing to acquire a single photodiode, and using PD2 as a charge drain, not collecting charges

PIXEL ARRAY

RELATED APPLICATION

This application claims the benefit of the filing date of British Patent Application 1221516.6 filed Nov. 29, 2012, which is incorporated herein by reference.

TECHNICAL FIELD

This invention relates to a pixel array for imaging and an imaging apparatus, such as a digital camera, which includes the pixel array.

BACKGROUND

Autofocus lenses as used, for example, on digital cameras mostly use a feedback loop to focus. Optical sensors are used to determine if the image scene is properly focused. Several principles, such as contrast based autofocus or phase autofocus, are employed. Contrast based autofocus is based upon calculation of the contrast in a certain area of the scene, around the object to be focused. The focus of the lens is adjusted with a control loop until a maximum contrast is achieved. The contrast measurement does not indicate the direction of the focus. Therefore it can take some time before the correct focus setting is achieved. Phase detect autofocus measures separately the projected spot of the object to be focused as it is seen from distinct parts of the lens, on separate optical detectors. The focus is adjusted until the same response is achieved on both detectors. This ensures a correct focus. From the peak response of the different phase autofocus detectors, the focus direction and the amount of focus adjustment can be calculated. This results in much faster focusing. In many single lens reflex cameras this is done with a dedicated phase detect autofocus sensor, which is illuminated via the mirror in the camera or via a beam splitter or prism. However, in a live view mode or video mode, this secondary phase autofocus sensor cannot be used. Also in cameras without a mirror or prism, a faster phase autofocus is being implemented.

FIG. 1 shows a camera composed of a simple lens and an image sensor. When the object is focused correctly by the lens, all optical rays from the object are correctly projected onto the same location on the image sensor. When the object is incorrectly focused, different rays of the object are projected on different locations on the image sensor, as shown in the Figure. This results in a blurred image.

FIG. 2 shows more detail on how the lens actually focuses the object. An object at the principal axis of the lens is shown. A pixel array is shown, indicated by microlenses and photodiodes. The principal ray goes directly from the object to the pixel array. The centre pixel sees the object through this principal ray. The centre pixel also sees this object through rays from the edge of the lens, from all sides of the lens. If part of the pixel is made insensitive, by any means, only rays from one side of the lens will project the object on to the pixel. This is shown at the bottom of FIG. 2. On the left drawing, the right part of the pixel is made insensitive. The lens still focuses the object correctly onto the pixel but only the left part of the lens is used. On the right drawing, the left part of each pixel is made insensitive. In that case, only the right part of the lens is used. The object is still correctly focused in this drawing, and all the rays are projected on the same pixel.

The situation when the object is not in focus, is shown in FIG. 3. In the case shown in the drawing, the object is closer to the lens, and the object is focused in front of the image sensor. When now the right part of the pixel is made insensitive, the rays of the object are create a response at the pixels at the right of the principal ray. When the left part of the pixels is made insensitive, the rays of the object create a response at the pixels to the left of the principal ray. The response of the different rays for different focus positions is also shown in FIG. 1. A cross-section of two phase detect autofocus pixel with a light shield and two different exit pupils are shown in FIG. 4, together with a cross-section of a normal pixel. The unused area of a pixel is covered by a light collecting charge drain. This light shield is implemented using a metal layer on top of the photodiode. This can be an extension of the metal routing that is present in between pixels towards one side, as shown in FIG. 4. It can also be a dedicated metal layer, or another non-transparent material, that is deposited on top of the photodiode.

Several different techniques have been proposed to use phase autofocus pixels as part of a pixel array. All use partially masked phase pixels with a light shield. These pixels employ a light shield above the pixel, so that the phase autofocus pixel only receives the light from a part of the main lens. Pairs or multiple of such autofocus pixels are then used in order to calculate the focus distance and adjust the lens focus. Implementations of such can be found for example in the following patents and patent applications: Japanese Patent Application JP2011250325A (Fujifilm), International Patent Application WO 2010/101096A1 (Canon), International Patent Application WO 2011/055617 (Canon), EP 2 330 449 A1 (Sony) and U.S. Pat. No. 8,098,321 (Sony).

The above referenced documents all describe the use of a light shield to cover part of the pixels or part of the pixel pairs. The light shield is used to form an exit pupil for the phase autofocus pixel. This exit pupil selects only rays that come from a part of the camera lens. The focus is then adjusted until the rays from different parts of the lens are projected on the same pixel. The response of the pixels with light shield depends on the distance between the light shield and the photodiode and on the distance between the light shield and the microlens.

SUMMARY

An aspect of the invention provides a pixel array for imaging comprising an array of pixels of a first pixel type and a second pixel type. Each pixel of the first pixel type comprises a first photo-sensitive element having a first area. Each pixel of the second pixel type comprises a second photo-sensitive element having a second area, which is smaller than the first area, and a third photo-sensitive element. Only the second photo-sensitive element in the pixel of the second pixel type is connected to a readout circuit. The third photo-sensitive element is connected to a charge drain via one of a permanent connection and a switchable connection.

An advantage of an embodiment is that a light shield is not required over part of a pixel and the present invention includes pixels without a light shield. This simplifies the manufacture of the pixel array by removing the manufacturing step of forming a light shield at a suitable distance from the photo diodes of the pixel. It can also allow the pixels of the second pixel type to have an improved selectivity with respect to angle-of-incidence of light, such as by avoiding issues of internal reflections between a silicon substrate of the pixel array and the light shield and by avoiding issues of requiring particular spacing distances between the light shield and the photo-sensitive element and the distance between the light shield and the microlens. Another advantage can be an improved performance in low light levels.

A pixel of array of this type can be used in a backside illuminated sensor, where light impinges on a side of the array opposite to where other components (e.g. gates) are formed. There is no need to form an additional metal layer on the backside illuminated face of the pixel array.

In at least some embodiments, the avoidance of a light shield allows the pixels of the second pixel type to be used for focussing and, additionally, for normal image capture as these pixels will receive a similar amount of light as pixels of the first pixel type. This avoids the need to interpolate an image value from neighbouring pixels.

In embodiments, the pixels of the second type are provided at locations within the pixel array for the purpose of focussing and advantageously for phase-detect autofocus. Each photo-sensitive element of the second pixel type occupies a portion of the total area of the pixel and is arranged to receive light rays over an angular range which is less than the angular range of a pixel of the first pixel type. This can be used to collect light rays which have reached the pixel via a particular path through the optics (e.g. lens system) of an imaging apparatus.

In an embodiment, readout circuitry is arranged to read out a signal from the second photo-sensitive element Only the second photo-sensitive element provides a signal value which can be read. Pixels of this kind can be provided in pairs in the array, and the second photo-sensitive element of one pixel in the pair is positioned on a different side of the pixel compared to the second photo-sensitive element of the other pixel in the pair. This allows each pixel of the pixel pair to receive light rays over substantially different angular ranges. This can be used to receive light rays which have travelled via different paths through the optics.

Readout circuitry may be shared between a pixel of the first pixel type and the second photo-sensitive element. Readout circuitry can include, for example, a reset transistor, a buffer amplifier (source follower) and a select transistor.

The pixel array can be a regular array of equally sized pixels. Pixels of the first pixel type and pixels of the second pixel type have the same size, such as a square, rectangle or hexagon. This allows the pixel array to be formed by a tessellated array of pixels of the first pixel type and pixels of the second pixel type. A pixel of the second pixel type can be positioned in the array directly next to a pixel of the first pixel type without the need to dedicate a line of the array for autofocus pixels.

The pixel array can have a rectangular matrix of rows and columns, or any other suitable pattern, such as a slanted array, a hexagonal array or an octagonal array.

A microlens can be positioned above each of the pixels. A single microlens can be positioned above the first photo-sensitive element. A single microlens can be positioned above a combination of the second photo-sensitive element and the third photo-sensitive element.

The first pixel type can have a single photo-sensitive element.

The second photo-sensitive element and the third photo-sensitive element can be of substantially equal area and/or shape. Alternatively, the second photo-sensitive element and the third photo-sensitive element can have different areas and/or shapes.

The second area of the second photo-sensitive element can be substantially half of the first area of the first photo-sensitive element.

The photo-sensitive element can be a photodiode.

The pixel array can be manufactured using a technology such as Complementary Metal Oxide Semiconductor (CMOS).

Another aspect of the invention provides a method of operating a pixel array for imaging comprising providing an array of pixels of a first pixel type and a second pixel type, wherein each pixel of the first pixel type comprises a first photo-sensitive element having a first area, each pixel of the second pixel type comprises a second photo-sensitive element having a second area, which is smaller than the first area, and a third photo-sensitive element, wherein only the second photo-sensitive element in the pixel of the second pixel type is connected to a readout circuit, and wherein the third photo-sensitive element is connected to a charge drain via one of a permanent connection and a switchable connection. The method further comprises using the readout circuit to read the second photo-sensitive element. The method further comprises draining charges from the third photo-sensitive element without reading a signal value from the third photo-sensitive element.

Another aspect of the invention provides an imaging apparatus comprising a pixel array.

The imaging apparatus can comprise control logic which is arranged to determine focus of an imaged object using at least two signal values read from at least two pixels of the second pixel type.

The imaging apparatus can be in the form of a digital camera for capturing still images and/or video.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 5:
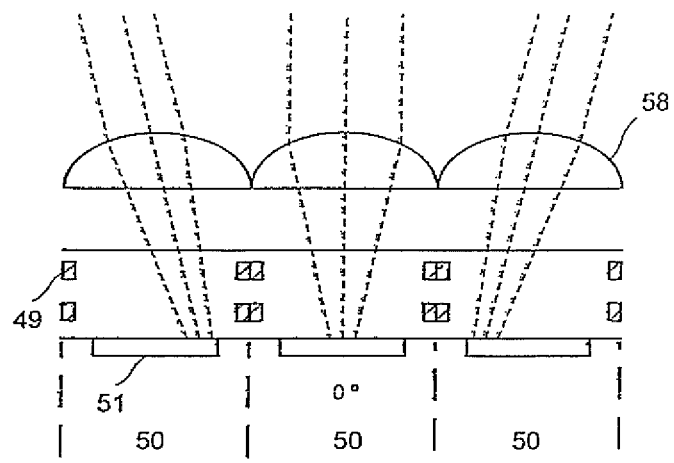
FIG. 5 shows a cross-section of a regular pixel with microlens, and how the light rays are converged to the photodiode by the microlens.

Before describing embodiments, FIG. 5 shows a cross-section of three pixels 50 forming part of a pixel array. Each pixel 50 comprises a photodiode 51 on a substrate. A microlens 58 is positioned above each pixel 50. Metal routing 49 is also shown. Light rays received via a lens (not shown) are projected onto the pixel array with 3 different angles. The centre pixel receives light that is projected perpendicular onto the pixel array. The microlens 58 focuses this light bundle to a spot in the centre of the photodiode 51. The left and right pixels 50 receive light that falls on the photodiode 51 at a non-perpendicular angle. The microlens 58 still creates a spot, but the centre of that spot is shifted to the outsides of the pixel 50.

Figure 6:
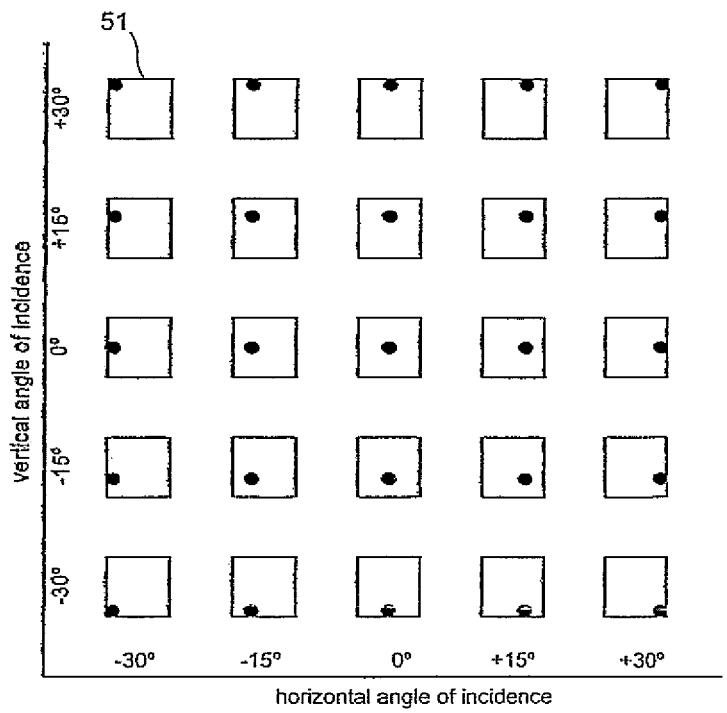
FIG. 6 shows the position of the light spot created in the pixel after convergence by the microlens, as a function of the angle-of-incidence of the incoming light ray.

FIG. 6 shows how the spot projected by the microlens 58 shifts as a function of the horizontal and vertical angle-of-incidence of the light rays. It is clear that the spot is shifted to the outside when the light is projected non-perpendicular to the array. The light coming from the outer sides of the lens pupil will be presented more to the outside of the pixel photodiodes, than the light from the principal ray, which goes straight from the object through the centre of the lens to the pixel.

Embodiments of the invention split the photodiodes in phase detect autofocus pixels into (at least) two parts. Each of the phase detect autofocus pixels has two photodiodes instead of one photodiode. An autofocus pixel can have two readable photodiodes, i.e. a signal value can be read from each of the two photodiodes. In embodiments, an autofocus pixel has a single readable photodiode, i.e. a signal value can be read from one of the two photodiodes, and a dummy photodiode from which a signal value cannot be read.

Figure 1:
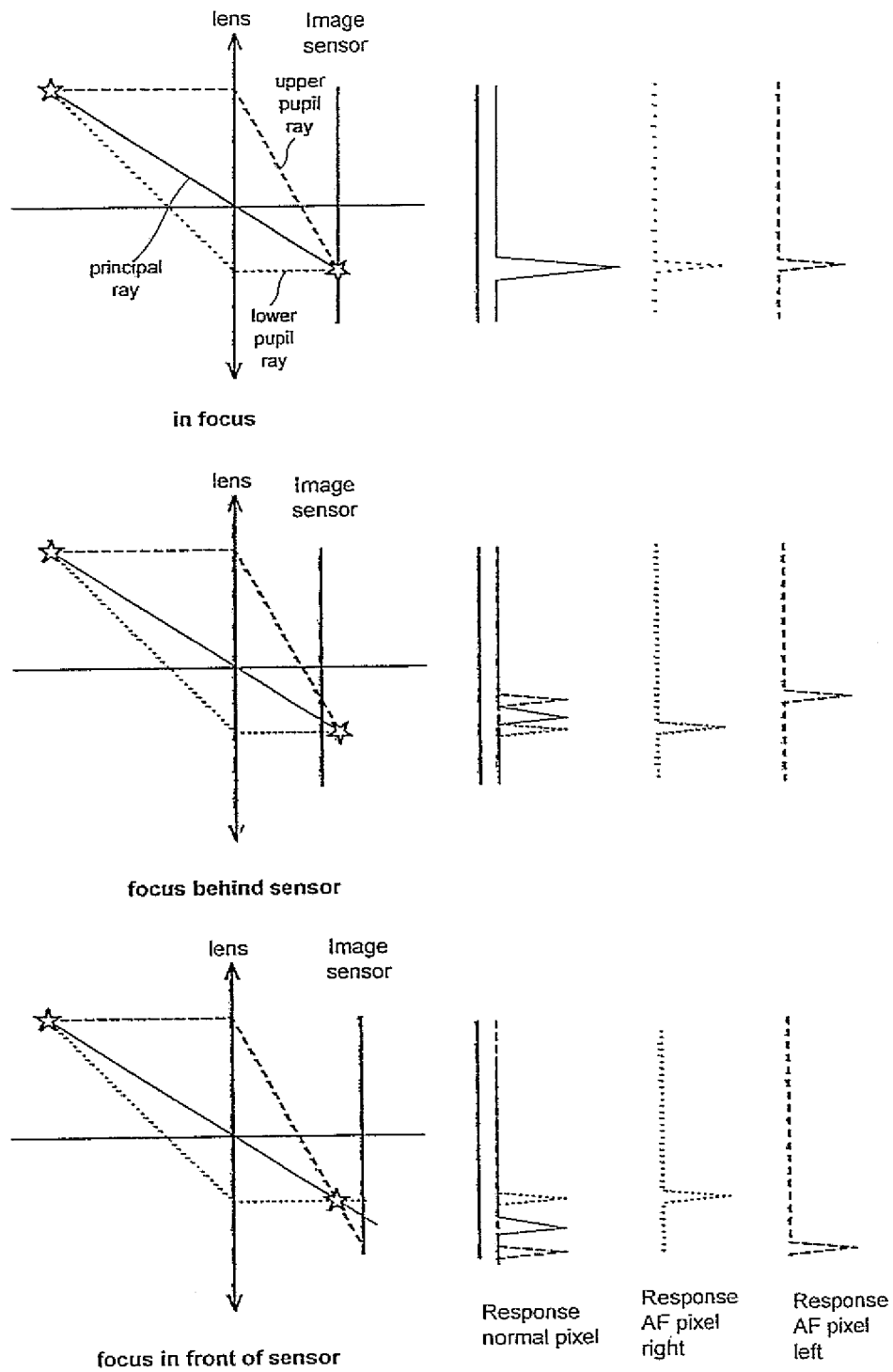
FIG. 1 shows how an object is projected on an image sensor when in focus, and when the focus is in front of or behind of the sensor.
Figure 2:
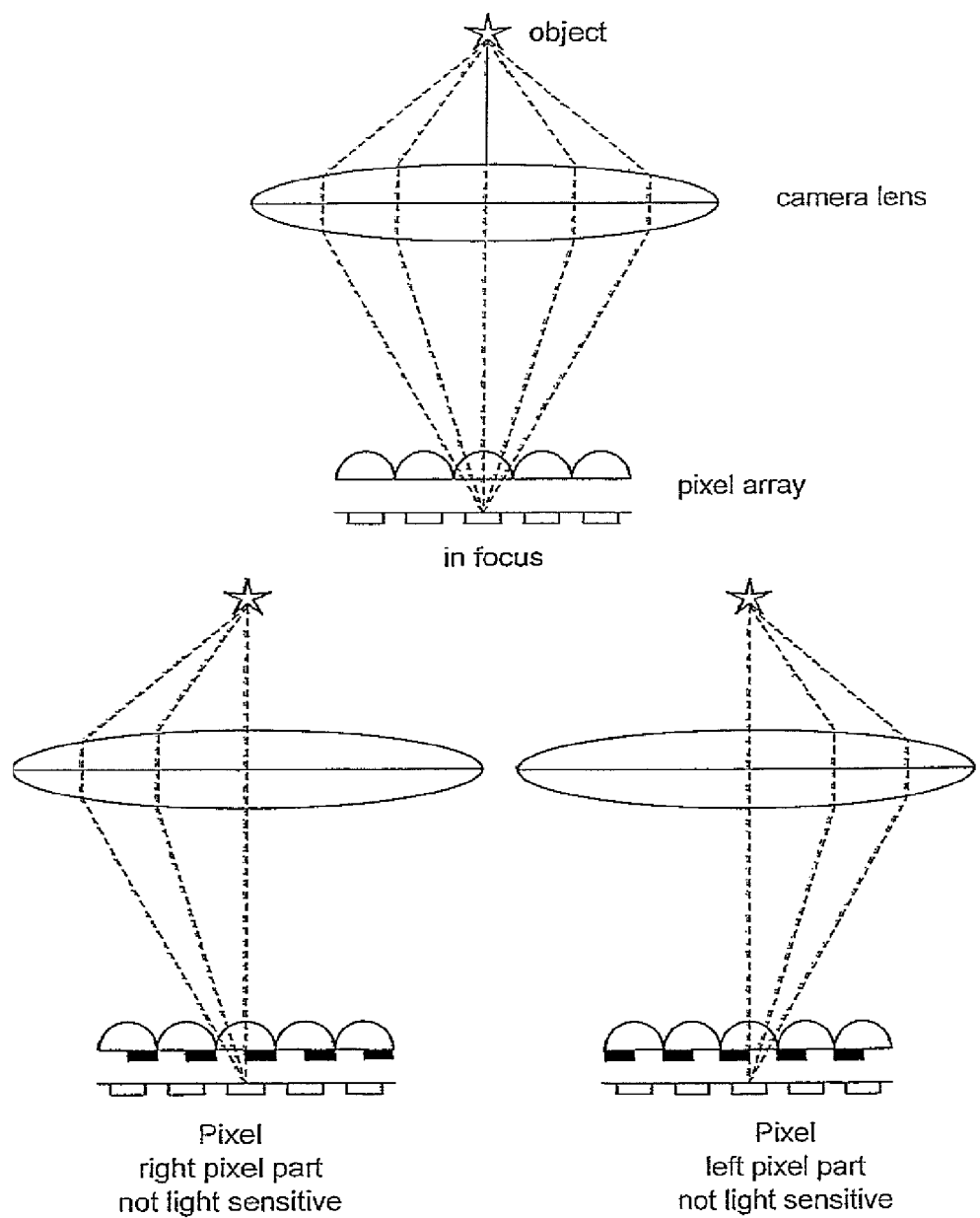
FIG. 2 shows how the optical rays from the object are projected onto the pixel array of the image sensor and how the rays are projected if part of the pixel is not light sensitive, when the object is in focus.
Figure 3:
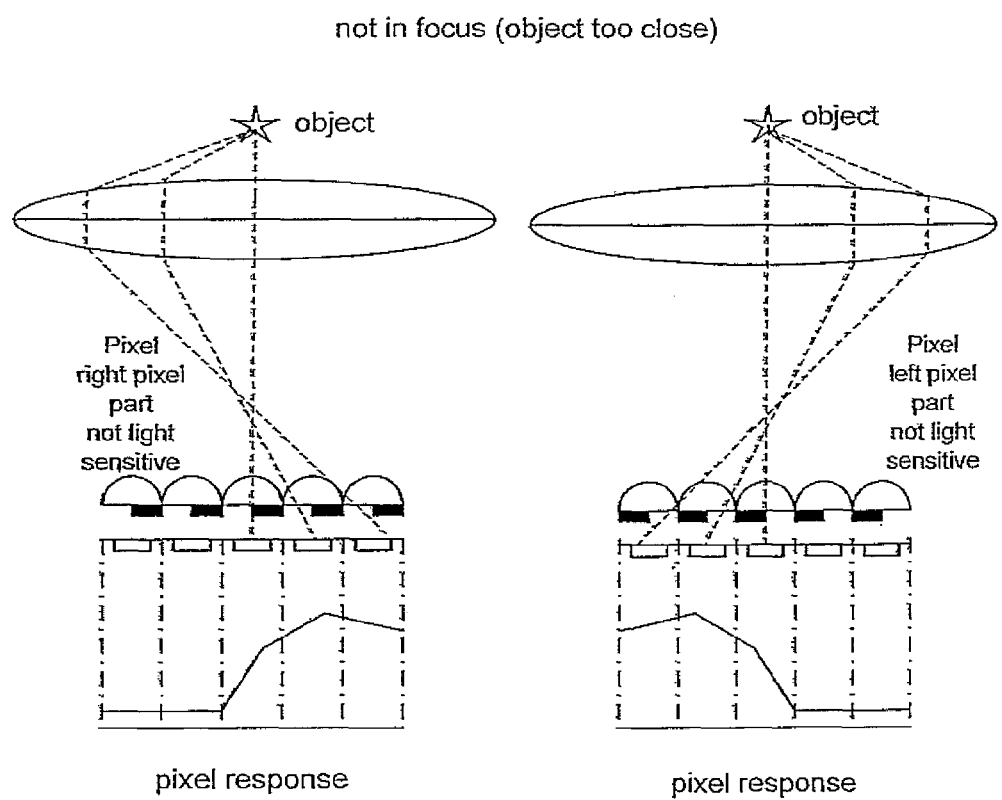
FIG. 3 shows how the optical rays from an object are projected onto the pixel array, when part of the pixel is not light sensitive and when the object is not in focus.
Figure 4:
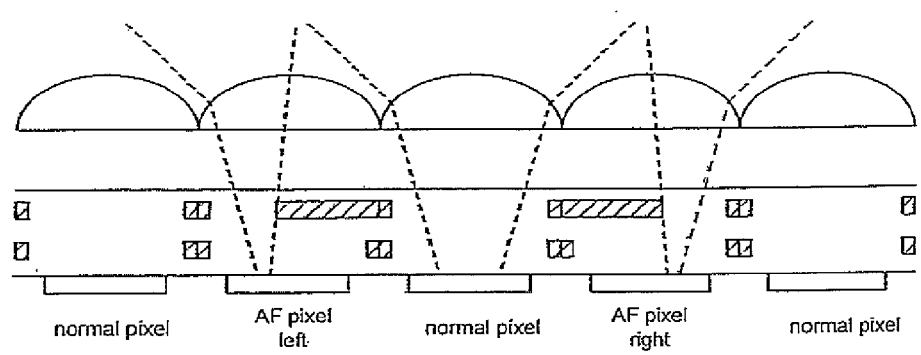
FIG. 4 shows the cross-section of a phase detect autofocus pixel using a light shield on top of the photodiode.
Figure 7:
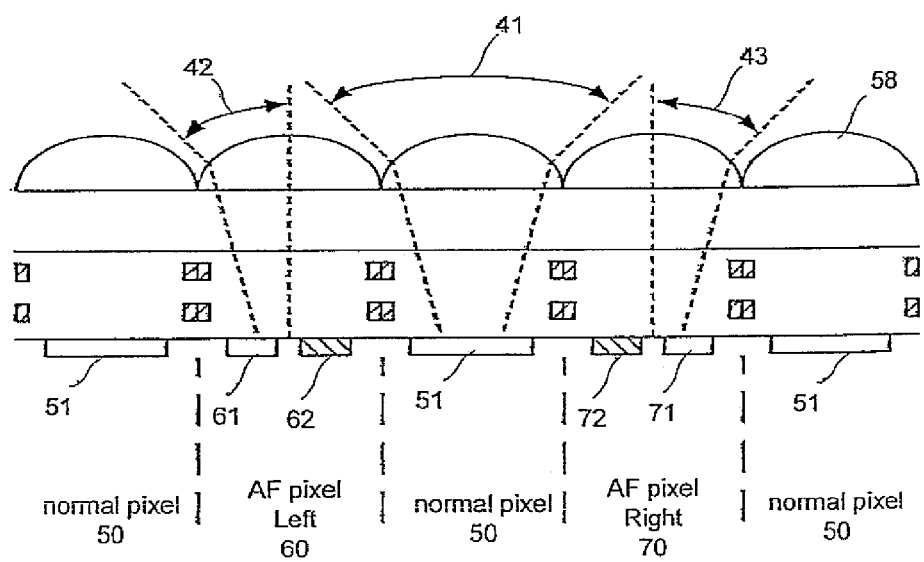
FIG. 7 shows a cross-section of a set of 5 pixels, of which 2 pixels are phase detect autofocus pixel with one charge-integrating photodiode and a photodiode connected to a charge drain.

FIGS. 7 and 8 show an embodiment of an autofocus pixel with a single readable photodiode. FIG. 7 shows a cross-section through a line of pixels of a pixel array. Pixels 50 are conventional, such as pixels with a single photodiode 51. Pixels 60, 70 are autofocus pixels which can be used for phase detect AF. In each of the AF pixels 60, 70, one photodiode 61, 71 of the two photodiodes is connected to a readout circuit for the pixel, and the other photodiode 62, 72 is a dummy photodiode which is connected to a charge drain. Charges collected by the dummy photodiode 62, 72 are drained away, e.g. to the pixel supply voltage. Charges collected by the first photodiode 61, 71 are integrated, read out and used for the phase autofocus detection. The dummy photodiode 62, 72 which is connected to a charge drain can be altered between left and right position in different ones of the AF pixels.

Each of the pixels 50, 60, 70 have a different response to light impinging on the array. FIG. 7 shows what range of light ray angles are collected by each of the photodiodes of the AF pixels 60, 70. It shows what part of the lens exit pupil is actually seen from each of the two photodiodes of the AF pixel. The photodiode 61 (and also charge drain or photodiode 72) receive all light rays with angles as indicated within the angular range 42. Photodiode 71 (and charge drain or photodiode 62) receive all light rays within the angular range 43. FIG. 7 shows, for each pixel 50, 60, 70 a respective angular range 41, 42, 43 over which light impinging on a microlens 58 above the pixel will be received by a pixel. Conventional pixel 50 receives light which impinges on microlens 58 over a wide angular range 41. AF pixel 60 receives light which impinges on microlens 58 over an angular range 42, which is predominantly from the left-hand side. AF pixel 70 receives light which impinges on microlens 58 over an angular range 43, which is predominantly from the right-hand side. Each of the angular ranges 42, 43 is less than angular range 41 and can be around half of angular range 41. In this example, angular range 42 is the same as angular range 43, but the direction from which light is received is different for pixels 60 and 70. It will be appreciated that FIG. 7 is a 2D slice through a plane orthogonal to the pixel array. A similar diagram can be drawn for other orthogonal planes.

Figure 8A:
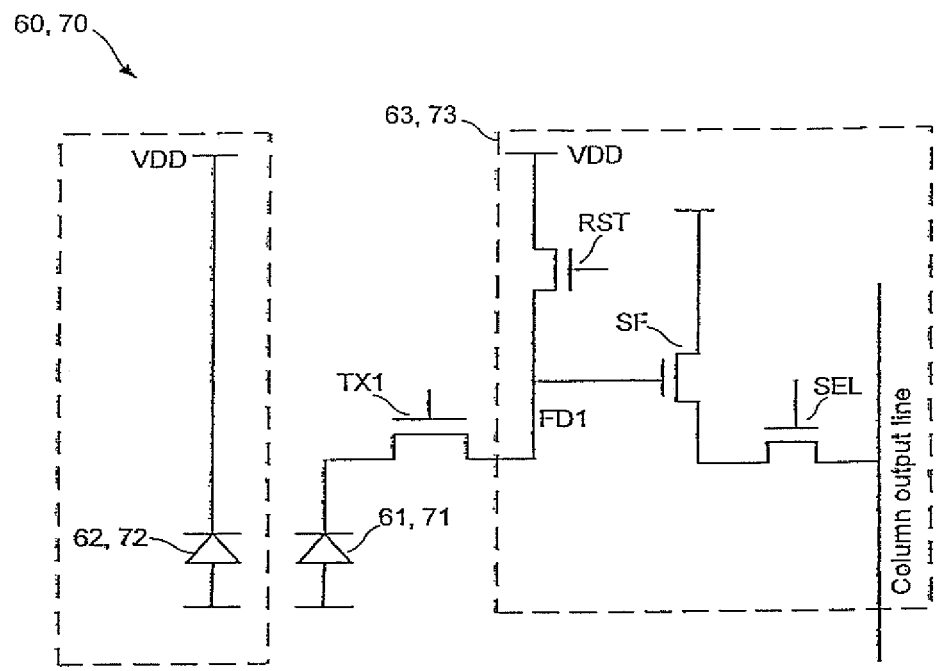
FIG. 8A schematically shows one of the autofocus pixels of FIG. 7A.

FIG. 8A shows an example schematic of the autofocus pixel 60, 70, based on a conventional 4T pixel. A first photodiode 61, 71 is connected, via a transfer gate TX1, to a sense node (also called a charge conversion node or a floating diffusion) FD1. A reset transistor RST connects between the sense node FD1 and a supply line VDD. Transistor SF is also connected to the sense node FD1 and is configured as a source-follower amplifier which acts as a buffer amplifier for the signal generated by the photodiode 61, 71. A transistor SEL connects between the output of the buffer amplifier SF and an output bus and is controlled by a control line. A second (dummy) photodiode 62, 72 is connected, via a metal contact to the photodiode 62, 72, to a high potential VDD. In a known way, photodiode 61, 71 will generate an amount of photocharges proportional to an amount of light received at the photo diode 61, 71 during an exposure period. At the end of the exposure period, the transfer gate TX1 is operated to allow the charges to flow to the sense node FD1, where the amount of charges is converted to a voltage signal which can be read out.

Figure 8B:
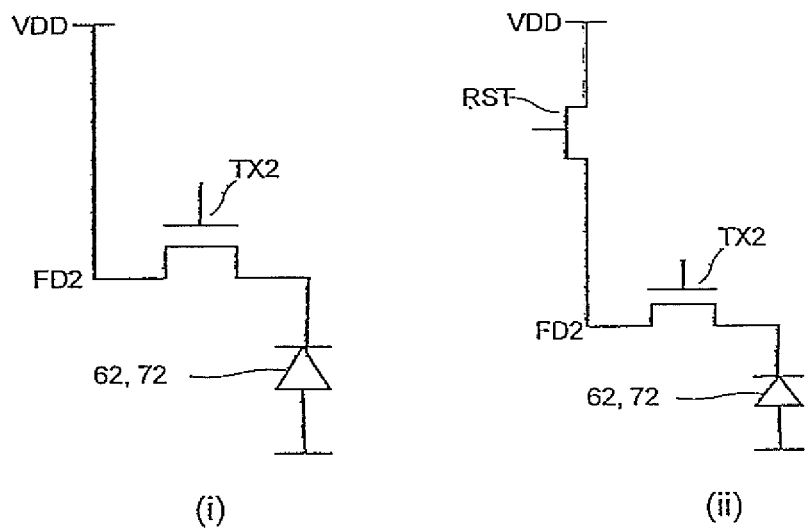
FIG. 8B shows some other possible configurations for connecting a photodiode to a charge drain.

FIG. 8B shows some other possible configurations for connections to the dummy photodiode 62, 72. In option (i) there is a switchable connection, via a transfer gate TX2, to a dummy floating diffusion FD2 which is connected to a high potential VDD. The floating diffusion FD2 can be the same (identical) to FD1, e.g. same implants. However, because it is permanently tied to a charge drain (VDD) it does not "float" in the normal way that a floating diffusion would during operation of the pixel array. Option (ii) is similar to option (i), but with a switchable connection between the floating diffusion FD2 and high potential VDD provided by a switch, which can be a reset switch RST which is similar to the reset transistor in a normal pixel. In this option, the floating diffusion can operate in the same manner as a normal floating diffusion although it still cannot be read, as there is no connection to a readout circuit. The addition of FD2, TX2, RST in FIG. 8B provide some more symmetry in the electric fields inside the pixel. If one photodiode is permanently drained to supply and the second photo diode is operated and integrating electric charges, there can be an asymmetry in the pixel response. Initially, electrons generated in the middle between both photodiodes will have an equal chance to be collected by each of the photodiodes. But as the amount of charge (electrons) builds up on one photodiode, the potential on that photodiode is dropping. That will increase the likelihood that an electron generated in the middle of the pixel will be collected by the photo diode with the highest potential. In FIG. 8A, the second photodiode PD2, permanently connected to the charge drain, remains at high potential while the voltage of the first photo diode PD1 is falling. It will appear as if the first photodiode PD1 becomes less sensitive as it collects charges. With TX2 operated in a same manner as TX1 (i.e. substantially at the same times), the photodiodes PD1, PD2 will have nearly the same electrical charge stored if the charge is generated at the centre of the pixel. When the charge is generated more under photodiode PD1 or more under photodiode PD2 that photodiode will collect more charge, which is an ideal response.

Figure 8C:
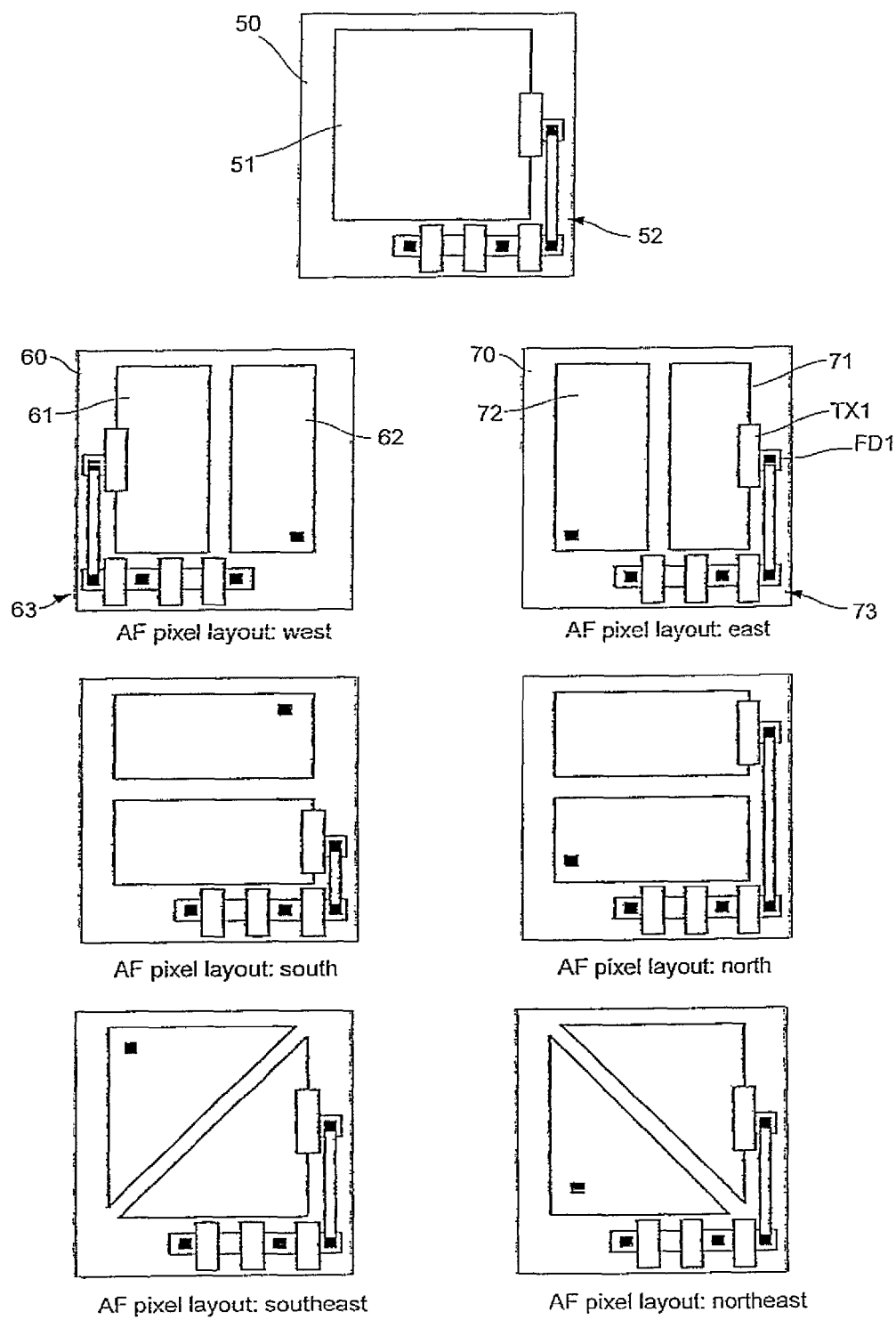
FIG. 8C shows a top view (layout) of a standard pixel and various phase detect autofocus pixels with one charge integrating photodiode and a photodiode connected to a charge drain.
Figure 15:
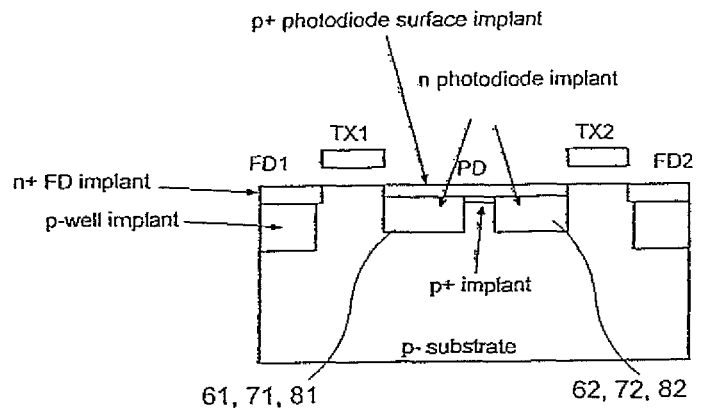
FIG. 15 shows how the photodiodes inside a phase detect autofocus pixel can be isolated from each other.
Figure 15:
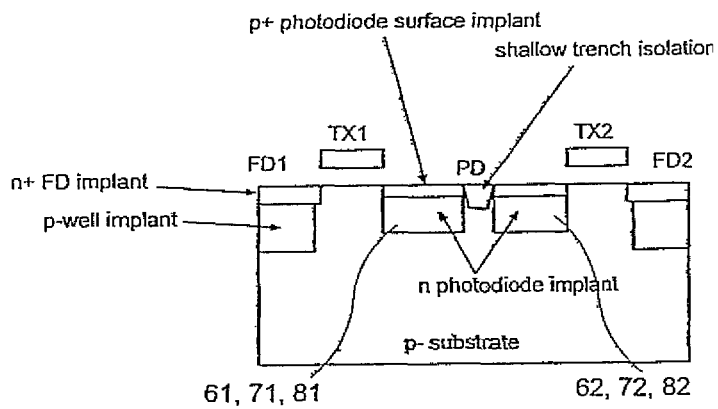
Figure 15:
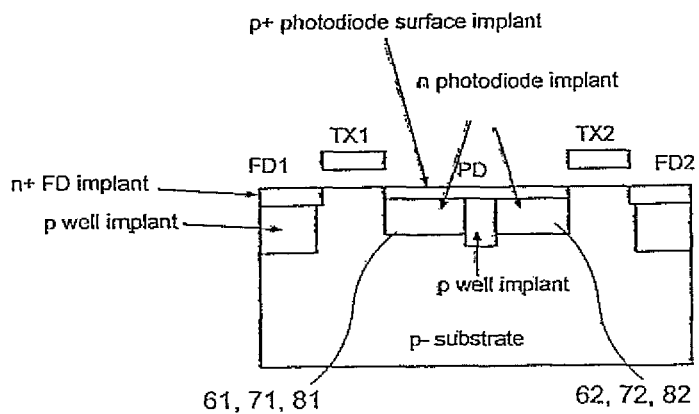
Figure 28:
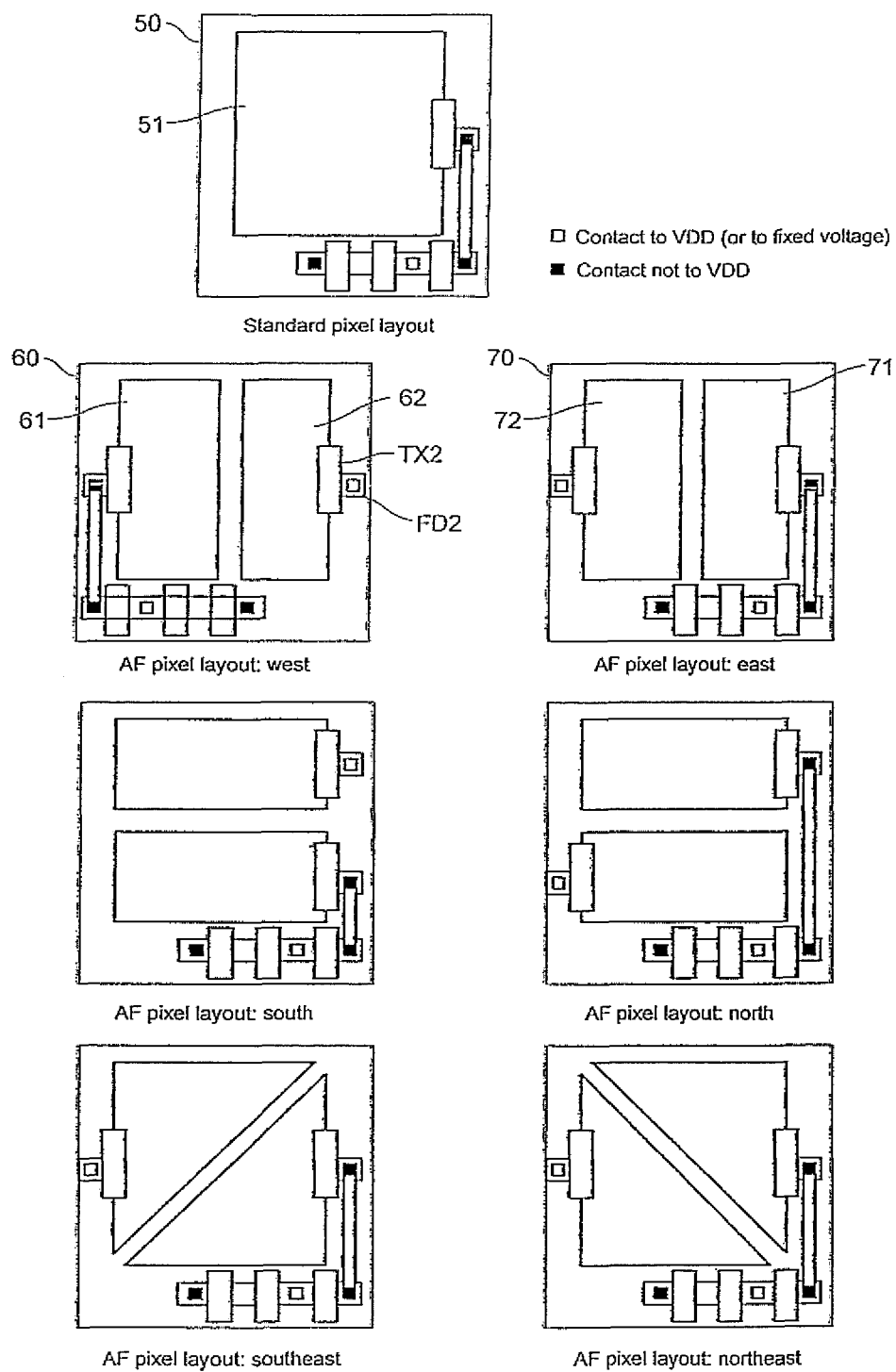
FIG. 28 shows a top view (layout) of a standard pixel and various phase detect autofocus pixels with one charge integrating photodiode and a photodiode connected to a charge drain via a switchable connection.

FIG. 8C shows top views of the pixel layouts as they appear when manufactured as a pixel array on a substrate such as silicon. The photodiode 51 of the standard pixels 50 covers most of the pixel area. For the phase autofocus pixels 60, 70, there are two photodiodes 61, 62; 71, 72. One photodiode 61, 71 is used as the active photodiode, the second photodiode 62, 72 is connected to a pixel supply voltage or DC voltage and drains away any charge collected by the photodiode. The photo diodes are shown, together with a transfer gate TX1, floating diffusion FD1 and other transistors of readout circuitry (i.e. reset transistor, source follower and select transistor) which is shown generally as 63, 73. Both photodiodes 61, 62; 71, 72 can be constructed in an identical way, although this is not essential. The isolation between the two photodiodes 61, 62; 71, 72 can be made in various ways. One possible way is by a shallow-trench isolation, as also used at the border of the photodiodes. A trench filled with oxide isolates the two diodes. The trench may or may not be pre-implanted with a p+ implantation to protect its surface. A second way of isolation can be based purely upon implantations. The n-type photo diode implantation can be skipped at the isolation area between the two photodiodes. A p-type implantation with comparable depth as the n-type photo diode implant can be implanted at the isolation location. The p+ surface implantation on top of the photodiode can be continued at the isolation position. It can be combined with or altered into a p++ surface implantation such as also used for substrate contacts and PMOS source/drain contacts. A p+ implant (e.g. boron) can be positioned between the photodiodes, as shown in the first scheme of FIG. 15. The p+ implant (e.g. boron) has an additional advantage that the boron acts as a gettering center for impurities and this reduces the hot pixels. Some of these isolation methods are shown in FIG. 15. All three examples shown in FIG. 15 operate as if they were separate photodiodes. There is only a difference in the way that the two diodes are isolated from one another. FIG. 28 shows a top view (layout) of a standard pixel and various phase detect autofocus pixels with one charge integrating photodiode 61, 71 and a photodiode 62, 72 connected to a charge drain via a switchable connection. The autofocus pixels correspond to the one shown in FIG. 8B (i), with a transfer gate TX2 and a dummy "floating" diffusion FD2 connected to VDD.

In FIG. 8C it can be seen that photodiode 61, 71 of an autofocus pixel 60, 70 has a smaller surface area than a photodiode 51 of a conventional pixel 50. This allows photodiode 61, 71 to generate a signal which is indicative of an amount of light which arrives at the pixel 60, 70 from a particular angular direction, via a main lens system of an imaging apparatus and a microlens 58 above the pixel 60, 70. In order to create a differential autofocus signal, several pixel variants can be employed within the pixel array. FIG. 8C shows three configurations of AF pixel pairs: a configuration with a vertical photodiode isolation (east and west); a configuration with a horizontal photodiode isolation (north/south); and a configuration with diagonally isolated pixel pairs. Two variants of the diagonal isolation are shown in FIG. 8C. Advantageously, for this embodiment of the autofocus pixels, pixels 60, 70 are provided in pairs in the array, such as a left AF pixel 60 and a right AF pixel 70. One pixel of the pair has a photodiode positioned on one side of the pixel (e.g. photodiode 61 on left side of pixel 60) and the other pixel in the pair has a photodiode positioned on the other side (e.g.

photodiode 71 on right side of pixel 70). Any of the types of division (horizontal, vertical, diagonal) can be used to form each pair.

Figures 20, 21:
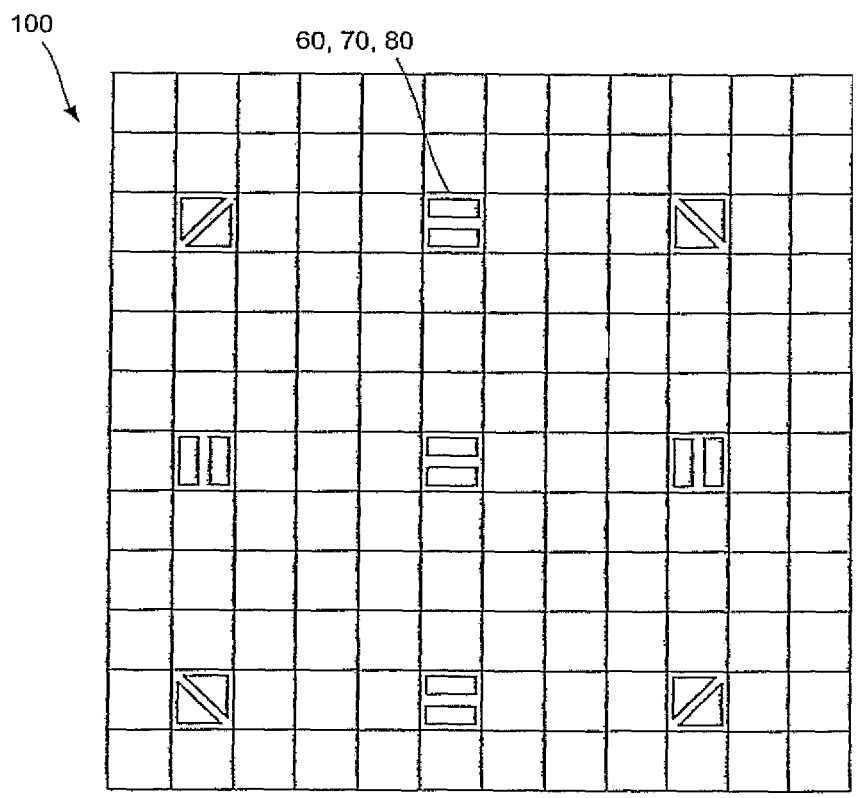
FIG. 20 shows a matrix of colour pixels of which some pixels are replaced by phase detect autofocus pixels.
FIG. 21 shows a possible configuration of phase detect pixels with horizontal, vertical and diagonal isolation to create an autofocus measurement point in the pixel array.

Different configurations can be employed at different locations in the pixel array. Typically, phase detect autofocus pixels are located near the centre of the image sensor, although they can be located anywhere in the array. The diagonal, horizontal and vertical AF pixels can be placed at different locations to improve the phase detect autofocus. One autofocus measurement point of the camera can then use information from pixels with horizontal, vertical and diagonal isolation. This is shown in FIG. 21. If a spot to be projected on the centre pixel (which is shown to have horizontally split photodiodes) is de-focussed, the de-focus will create a similar differential response on the 8 surrounding autofocus pixels. It is not required to use all of the different geometries shown in FIG. 8C; only one type of geometry of autofocus pixel can be used also with satisfactory results, e.g. just vertical division, just horizontal division or just diagonal division.

In the configurations shown in FIG. 8C each of the photodiodes 61, 62; 71, 72 has substantially the same surface area. Also, each of the photodiodes 61, 62; 71, 72 has substantially the same shape. This is an advantageous configuration. In other embodiments, the photodiodes 61, 62; 71, 72 may differ in area and/or shape. As an example of a configuration with different shapes, a pixel can have a first photodiode occupying a central region of the pixel and a second photodiode occupying a region around the first photodiode.

This first embodiment does not use a light shield, but still uses only a maximum of half of the incoming photons to create the signal for the phase autofocus pixels. The charges collected by the second, dummy photodiode are drained away. The dummy photodiode ensures that any charges generated within the area of the pixel covered by the dummy photodiode do not contribute to the signal of the first photodiode.

Figure 9:
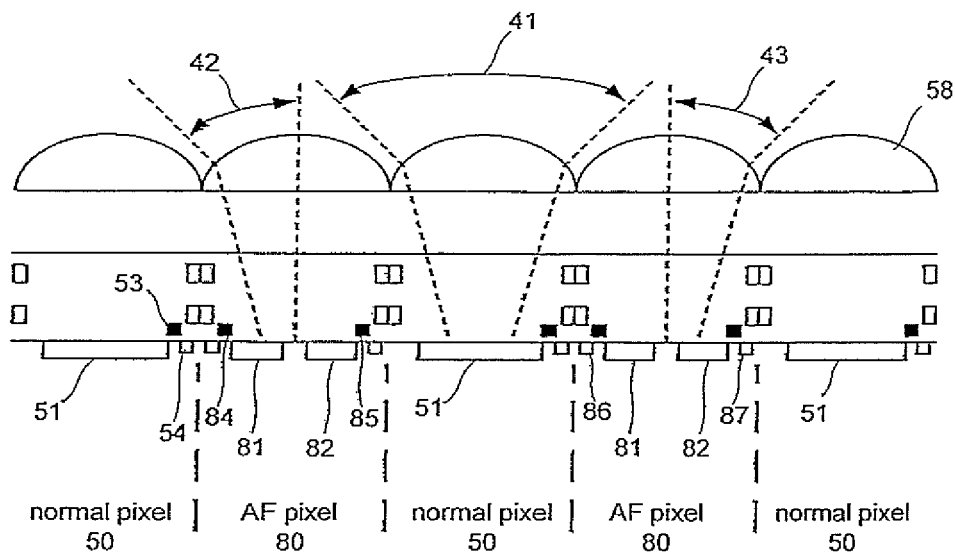
FIG. 9 shows a cross-section of a set of 5 pixels, of which 2 pixels are phase detect autofocus pixels with two photodiodes connected to separate readout paths.

FIGS. 9 to 14 show an autofocus pixel with a pair of readable photodiodes. FIG. 9 shows a cross-section through a line of pixels of a pixel array Pixels 50 are conventional, such as pixels with a single photodiode 51. Pixels 80 are autofocus pixels which can be used for phase detect AF. Each AF pixel 80 has two separate photodiodes 81, 82. A signal of each of the two photodiodes 81, 82 is now used. Each photodiode 81, 82 has a transfer gate 84, 85 to transfer the photocharges collected by the photodiode to a floating diffusion sense node. There may be a single sense node/floating diffusion or a floating diffusion per photodiode 81, 82. FIG. 9 shows a floating diffusion 86, 87 per photodiode. The floating diffusion is reset by a reset transistor, and read out using a source follower and select transistor, and can be identical to the readout of a standard pixel.

As previously described for FIG. 7, each of the pixels 50, 80 have a different response to light impinging on the array. FIG. 9 shows what range of light ray angles are collected by each of the photo diodes of the AF pixels 80. It shows what part of the lens exit pupil is actually seen from each of the two photodiodes of the AF pixel. The photodiode 81 receives all light rays with angles as indicated within the angular range 42. Photodiode 82 receives all light rays within the angular range 43. FIG. 9 shows, for each pixel 50, 80 a respective angular range 41, 42, 43 over which light impinging on a microlens 58 above the pixel will be received by a pixel. Conventional pixel 50 receives light which impinges on microlens 58 over a wide angular range 41. AF pixel 80 has two photodiodes 81, 82 which each receive light from different directions. Photodiode 81 receives light which impinges on microlens 58 over an angular range 42, which is predominantly from the left-hand side. Photodiode 82 receives light which impinges on microlens 58 over an angular range 43, which is predominantly from the right-hand side. Each of the angular ranges 42, 43 is less than angular range 41 and can be around half of angular range 41. In this example, angular range 42 is the same as angular range 43, but the direction from which light is received is different for photodiodes 81, 82. It will be appreciated that FIG. 9 is a 2D slice through a plane orthogonal to the pixel array. A similar diagram can be drawn for other orthogonal planes.

Figure 10:
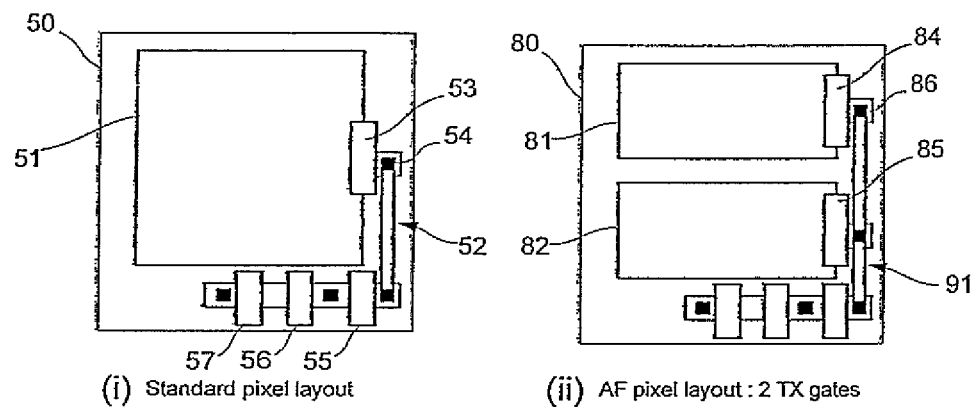
FIG. 10 shows a top view (layout) of: (i) a standard pixel; (ii) a phase detect autofocus pixel with two charge-integrating photodiodes and two transfer gates, and one readout circuit inside the pixel; and a phase detect autofocus pixel with two charge-integrating photodiodes, two transfer gates and two readout circuits inside the pixel.
Figure 10:
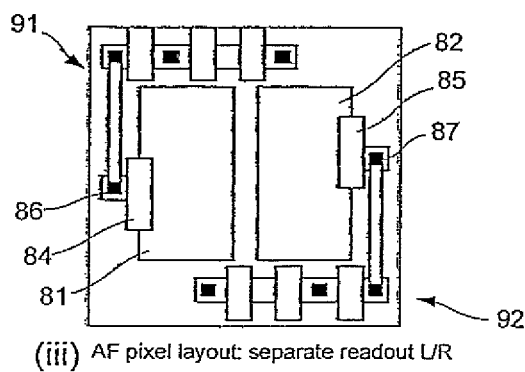

FIG. 10 shows the layout (top view) of one particular implementation, together with the layout (top view) of a standard 4-transistor active pixel 50. The standard pixel 50 has a transfer gate 53 that moves charges to the sense node 54. The reset transistor 55 resets the floating diffusion 54, the source follower 56 and select transistor 57 are used to select the pixel and read out its signal. The phase detect autofocus pixel 80 uses the same components but has also a second transfer gate 85, to connect the second photodiode 82 to the floating diffusion. The signals of the first and second photo diode 81, 82 can be read out immediately after another after the exposure. First the charge of the first photodiode 81 is transferred to the floating diffusion and read out. Immediately after, the charge of the second photodiode 82 is transferred to the floating diffusion and read out. The structure of FIG. 10 (ii) can be easily integrated into a pixel array of standard pixels 50.

FIG. 10 (iii) shows an alternative layout, with a vertical isolation between the two photodiodes 81, 82. In this implementation each photodiode 81, 82 has its own readout circuit 91, 92: besides two transfer gates 84, 85, there are also two reset transistors, two source followers and two select transistors. The pair of photodiodes 81, 82 can have any of the configurations shown in FIG. 8, i.e. vertical division, horizontal division or diagonal division.

Figure 11A:
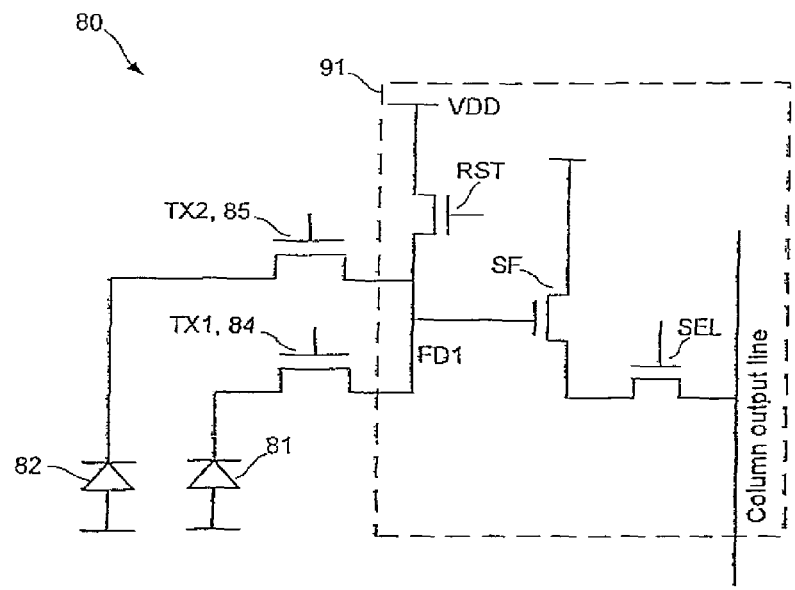
FIGS. 11A and 11B schematically show the autofocus pixels of FIG. 10.
Figure 11B:
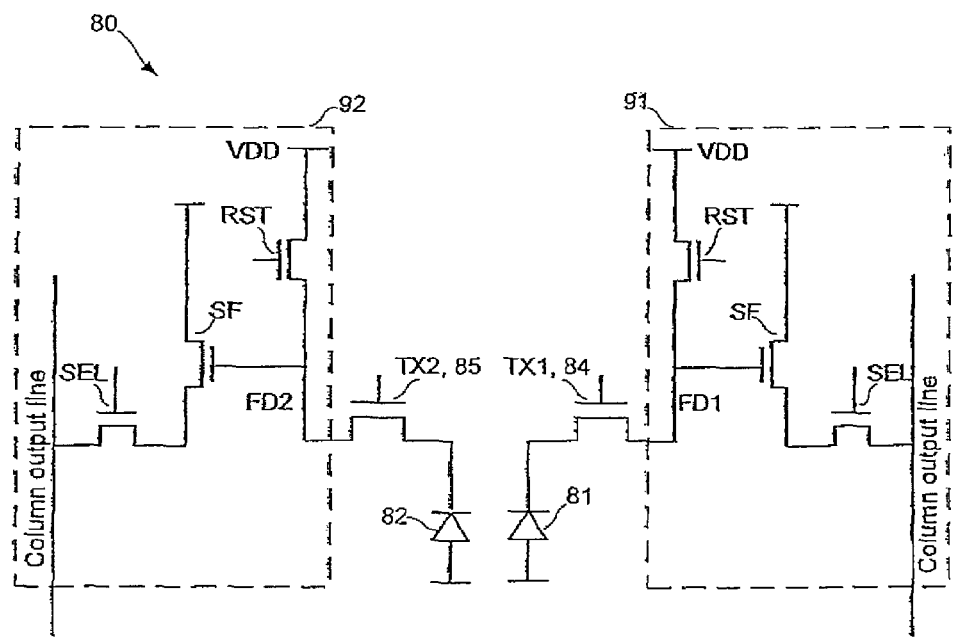

FIGS. 11A and 11B schematically show embodiments of the autofocus pixel 80. FIG. 11A corresponds to FIG. 10(*ii*) and FIG. 11B corresponds to FIG. 10(*iii*). In FIG. 11A, there is a transfer gate 84 for photodiode 81 and a transfer gate 85 for photodiode 82. A floating diffusion FD1 is shared by the photodiodes. Readout circuitry 91 is also shared by the photodiodes and the readout circuitry can selectively read out a signal from one of the photodiodes 81, 82, or a combined signal from both of the photodiodes 81, 82. This is described later with reference to FIGS. 24B and 24C. In FIG. 11B, there is a transfer gate 84 for photodiode 81 and a transfer gate 85 for photodiode 82. A floating diffusion FD1, FD2 and readout circuitry 91, 92 is provided for each of the photodiodes 81, 82.

Figure 12:
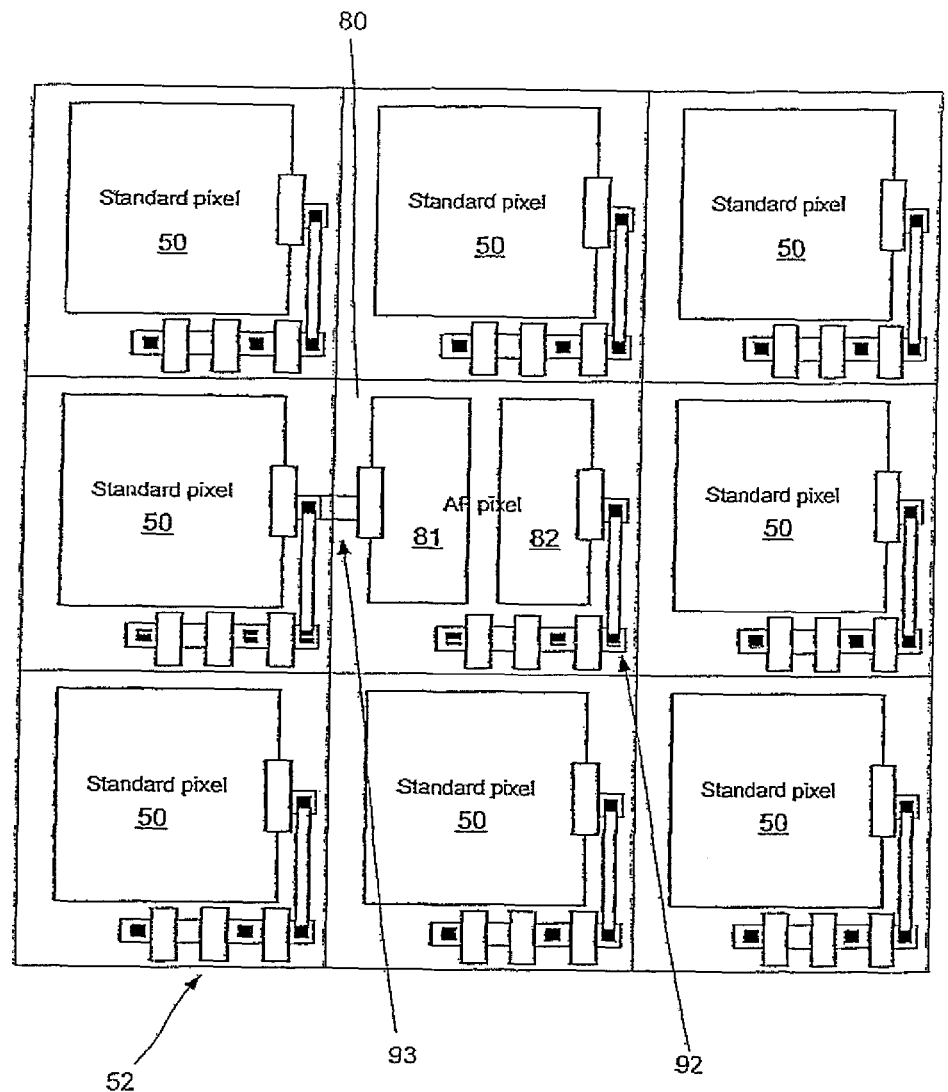
FIG. 12 shows a top view of a matrix of 3×3 pixels, of which the centre pixel is a phase detect autofocus pixel with two photodiodes with vertical isolation, of which one photodiode is read out by the readout circuit of a neighbour pixel.
Figure 13:
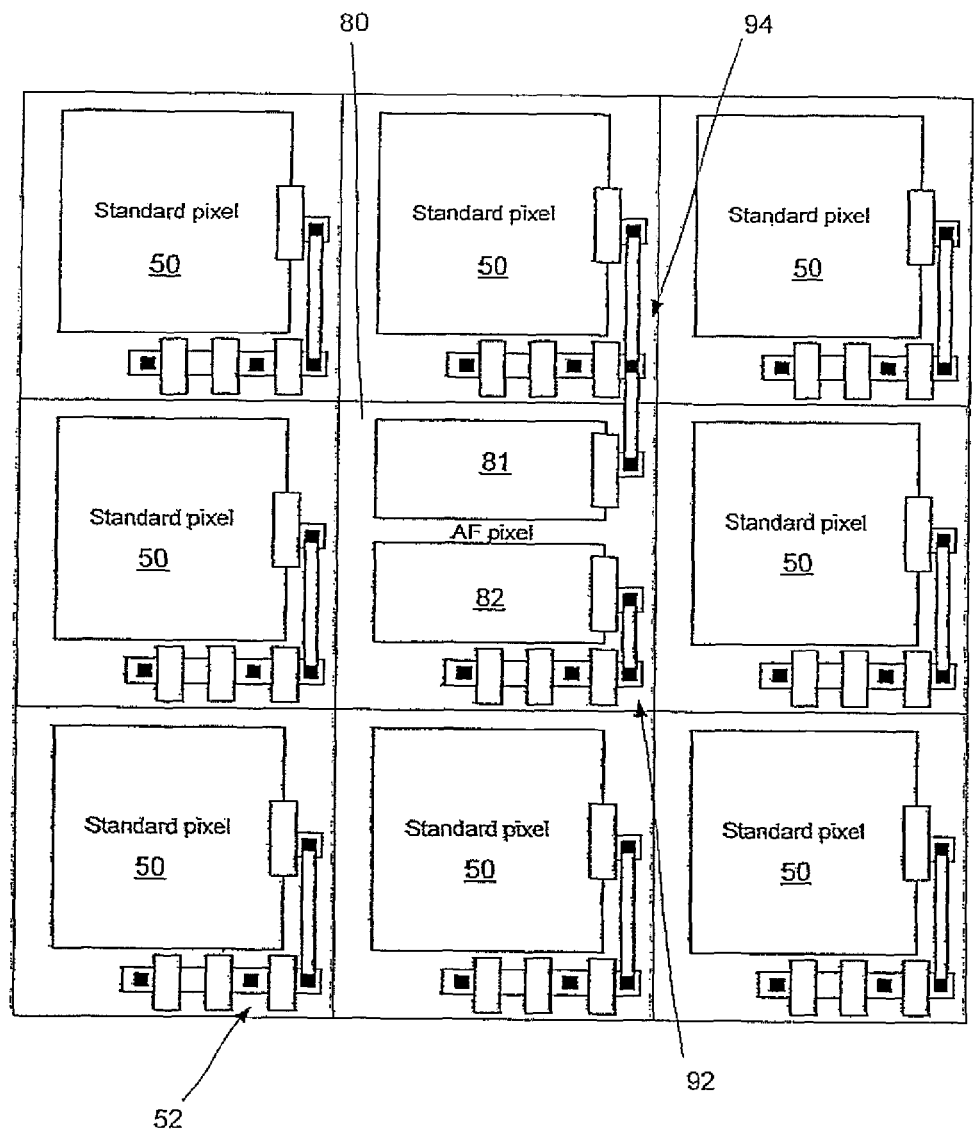
FIG. 13 shows a top view of a matrix of 3×3 pixels, of which the centre pixel is a phase detect autofocus pixel with two photodiodes with horizontal isolation, of which one photodiode is read out by the readout circuit of a neighbour pixel.
Figure 14:
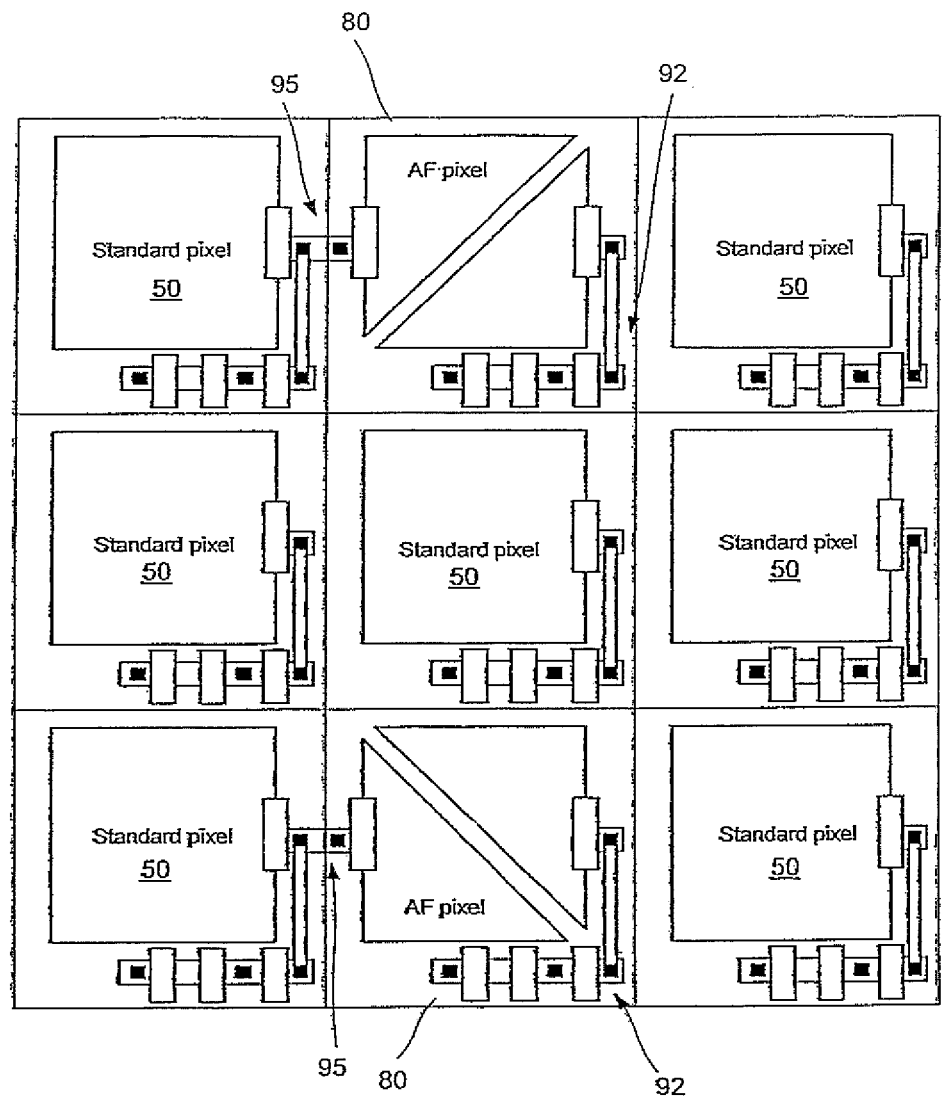
FIG. 14 shows a top view of a matrix of 3×3 pixels, of which the centre pixel of the first and third row are phase detect autofocus pixels with two photodiodes with diagonal isolation, of which one photodiode is read out by the readout circuit of a neighbour pixel.

FIG. 12 shows readout circuitry shared between an AF pixel 80 and a neighbouring, non-AF pixel, in the array. The left photodiode of the AF pixel 80 shown in the centre is now read out using the readout circuit 93 of the pixel 50 to the left of the AF pixel 80. Similarly, in FIG. 13, it is shown how the top photodiode 81 of the AF pixel 80 is read out using the transistors from the neighbouring pixel 50 at the top of the AF pixel 80. Similar principles are shown in FIG. 14 for pixels with a diagonal separation. The top photodiode of the top AF pixel 80 is read out using readout circuit 95 of the pixel 50 to the left of the AF pixel.

Figure 16:
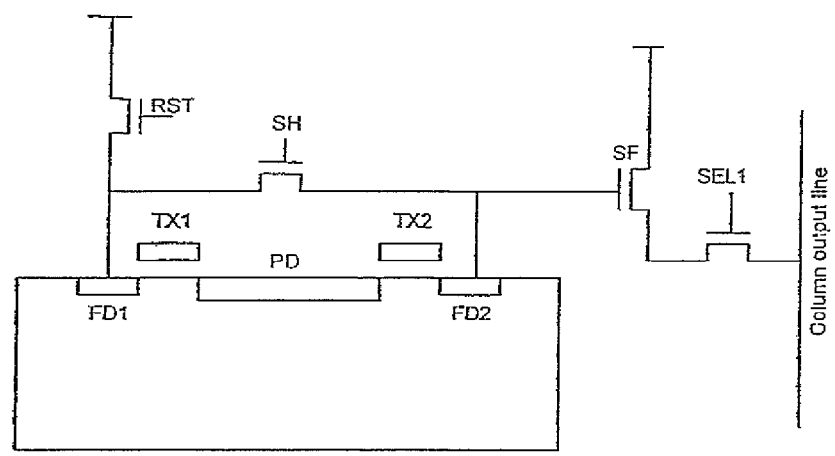
FIG. 16 shows a pixel schematic and cross-section for a pixel with dual transfer gates which can be used in an embodiment.
Figure 17:
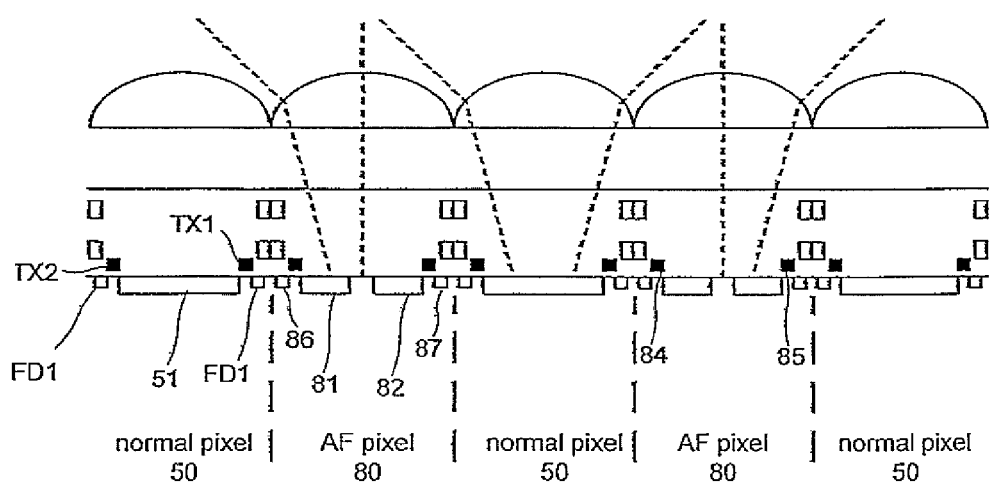
FIG. 17 shows a cross-section of a set of 5 pixels, of which the normal pixels are dual transfer gate pixels and the 2 phase detect autofocus pixels contain two photodiodes which each use a separate transfer gate.
Figure 18:
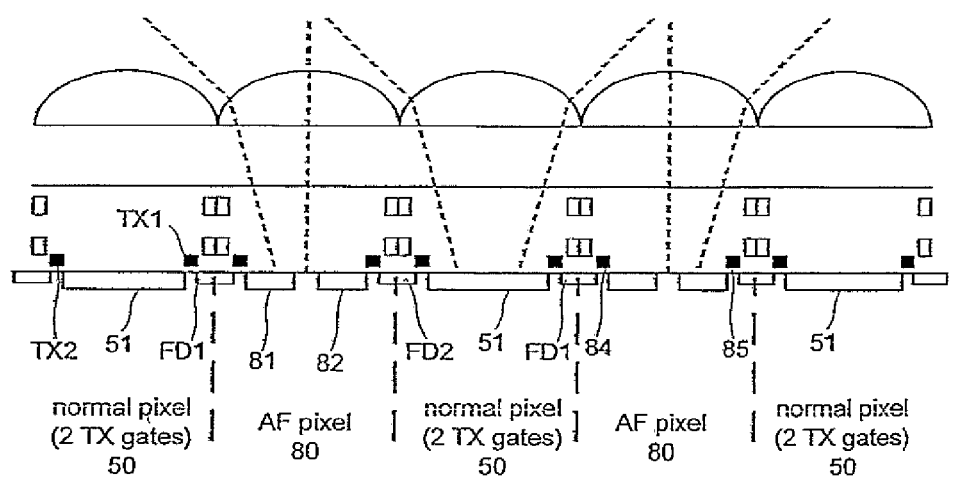
FIG. 18 shows a cross-section of a set of 5 pixels, of which the normal pixels are dual transfer gate pixels with shared readout and the 2 phase detect autofocus pixels contain two photo diodes which each use a separate transfer gate, and use the same shared readout.

Another example is shown in FIGS. 16, 17 and 18. FIG. 16 shows prior art as described in more detail in European patent application EP 2,346,079 of a pixel with two transfer gates. This pixel allows to read out a photodiode signal with a higher dynamic range. During the readout, the charge packet is split in two parts. A first part of the photocharge is transferred to a first floating diffusion FD1 using a first transfer gate TX1. The remaining part of the photocharge is transferred to a second floating diffusion FD2 using a second transfer gate TX2. The signals of FD1 and FD2 are then read out. Multiple ways of readout are described in European patent application EP 2,346,079. This pixel can be modified for phase autofocus detection as shown in FIG. 17. The photodiode can be separated into two separate autofocus pixels. The readout circuits that were originally intended to read out the two signals from the dual transfer gate pixel, are now used for readout of the signal of the two photodiodes. A different timing may be required. FIG. 18 shows the same principle for a dual transfer gate pixel with shared readout. Such pixel (also described in European Patent Application EP 2,346,079) shares floating diffusions of neighbour pixels for readout of the charge packet which that is split into two packets. For the phase autofocus pixels, the signals of the two diodes are then read out using the circuits of the two neighbour pixels.

Figure 19:
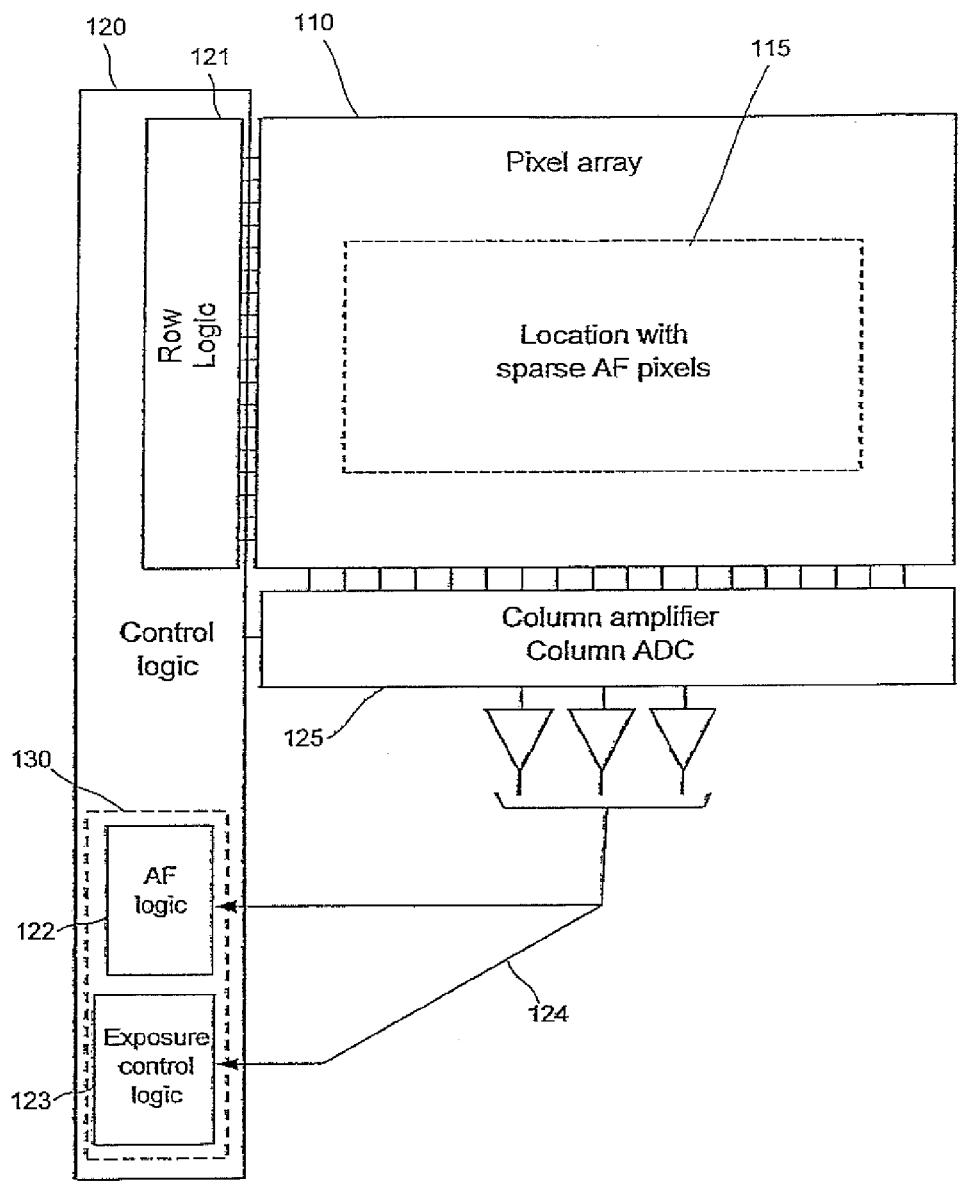
FIG. 19 shows the architecture of an image sensor and shows the location of phase detect autofocus pixels within the pixel array.

FIG. 19 shows the architecture of an image sensor. The image sensor comprises a pixel array 110 comprising an array of pixels which are a combination of pixels of the first pixel type (i.e. "normal" pixels 50) and pixels of the second pixel type (i.e. autofocus pixels). The pixel array comprises control logic 120 which includes row logic 121. An output stage 125 comprises column amplifiers and column analog-to-digital converters. The row logic is used to select a row of pixels for readout and also performs functions such as resetting pixels, operating transfer gates etc. The column amplifiers then amplify the signals of the particular column of that array. A column ADC converts in each column the signal into a digital number. This digital value is multiplexed and possibly serialized and transferred to a set out output drivers. The pixel array 110 is composed of a regular array of pixels, such as a square pattern. For colour imaging, colour filters are located over the pixels. A "Bayer" configuration is typically used, using a repeating pattern of 2×2 pixels comprising two pixels each with a green filter, one pixel with a red filter and one pixel with a blue filter. At the centre of the pixel array, an area 115 can be provided where the described autofocus pixels are located. These pixels are placed inside the pixel matrix at certain locations. Advantageously, the autofocus pixels occupy the position of the green pixels. FIG. 20 shows a pattern of pixels, wherein 4 regular pixels are replaced by phase autofocus pixels (indicated by A). These pixels can be of any of the autofocus phase detect pixels 60, 70, 80 as described in this application.

The image sensor can include dedicated circuitry and/or timing for the readout of the phase detect autofocus pixels 60, 70, 80 separately, or the data of the phase detect autofocus pixels 60, 70, 80 can be read out together with the data of the other pixels 50. A dedicated timing for readout of the phase detect autofocus pixels 60, 70, 80 is useful in case of still picture imaging. The phase detect information is then used to focus the camera prior to the capture of the actual image. Another possibility is the readout of a region-of-interest containing the phase detect autofocus pixels (such as the region 115 indicated in FIG. 19). The camera can then use the information of the phase detect autofocus pixels to calculate focus, and can use the image data to perform additional focus calculations based upon contrast autofocus. With high aperture lens settings (high F-number) the phase detect focus calculation may be not accurate enough to determine focus.

Control logic 122, 123 which uses outputs 124 of the pixel array 110 can be provided as part of an imaging apparatus. The control logic 122, 123 may be provided as part of the control logic 120 of the pixel array or image sensor or it may be provided as part of the control logic of an image pre-processor 130. An image pre-processor can be provided with control logic to determine the settings for the image sensor and lens for the next capture, in order to perform lens and sensor adjustments. The image pre-processor calculates a number of parameters from the image that is read from the image sensor. This includes the average intensity, and the sharpness in the image. The image pre-processor also calculates a numerical value for the difference between the response of the 2 photo diodes of the AF pixel or the difference between the 2 photodiodes of the AF pixel pair (in case of a single readable photodiode per AF pixel). From this differences at the various AF pixel locations, and possibly also from the contrast in a region-of-interest, the amount and direction of focus adjustment is calculated. The exposure conditions, such as exposure time, lens aperture and gain are calculated from the average intensity in the entire image or in one or multiple regions of interest of the image. The calculated parameters are fed back to the image sensor and lens for a next capture. When focus and exposure are correctly determined, the picture can be captured.

For video capture, the phase detect autofocus pixels can be read out separately, during the frame blanking time of the image stream, or the phase detect autofocus pixels can be read out during readout of the overall video image frame. The image processor then has to extract the information of these pixels out of the video frame, and may have to correct the information of the phase detect autofocus pixels using information from the neighbour pixels and/or the phase detect autofocus pixel itself.

For smaller pixel architectures, 2-shared, 4-shared other transistor sharing schemes are used. In such shared transistor schemes, neighbour pixels use the same readout transistors for readout of their charge packets. The principle of phase detection using split photodiodes inside the pixel can also be used for such pixel types.

Figure 22:
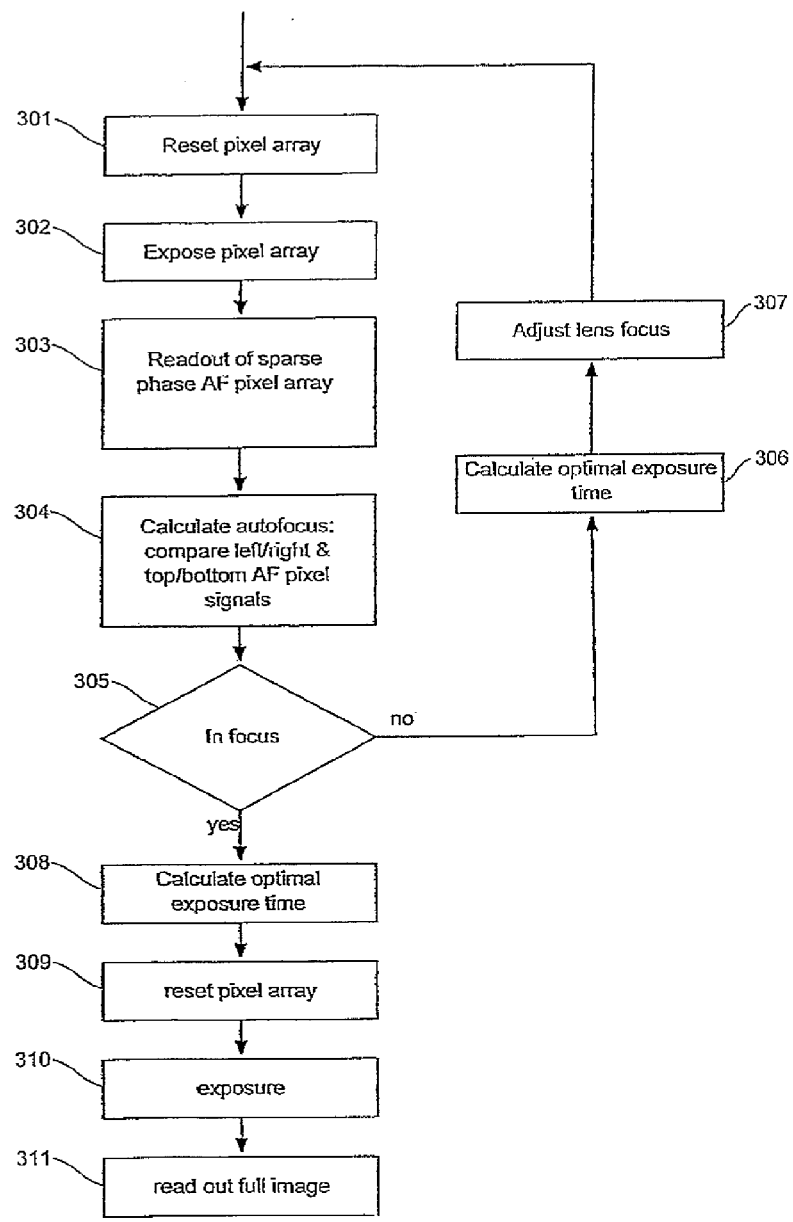
FIG. 22 shows a flowchart of a method according to an embodiment.
Figure 23:
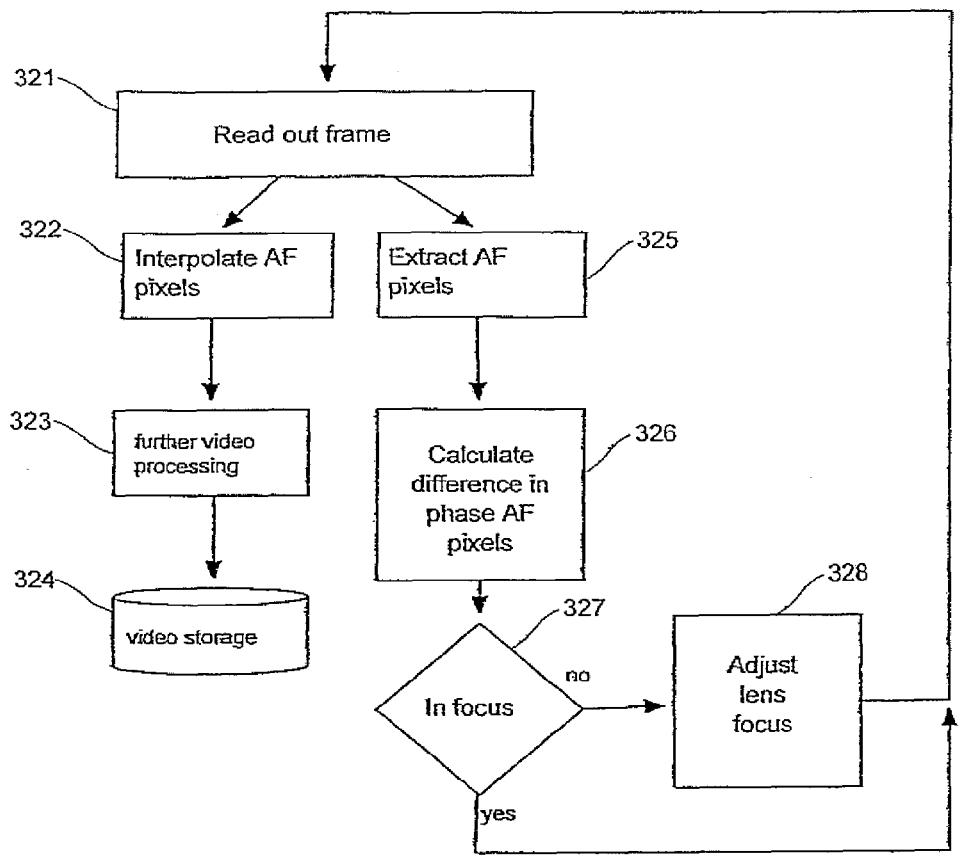
FIG. 23 shows a flowchart of a method of video capture.

FIGS. 22 and 23 shows a flowchart on how such autofocus pixels can be used in a camera system. FIG. 22 shows the case of a single snapshot, such as taken by a digital camera. Before the picture is taken, the lens should be focussed. This is done by a control loop in which the phase detect AF pixels are read out from the image sensor. The focus is calculated in each AF pixel, or in each AF pixel pair, by comparing the response of the two photodiodes inside the AF pixel, or the AF pixel pair data. If the object is in focus, the photodiode pairs or pixel pairs will have an identical signal. One possible control algorithm can calculate at first the root mean square sum of the AF pixels and then try to minimize the calculated value, by adjusting the lens focus. Another possible control algorithm can compare the data of different AF pixels, or AF pixel pairs, to calculate the amount of de-focus, and it can also determine if the focus point is in front of or behind the image sensor, and adjust the lens accordingly. Additionally, data from small regions-of-interest of normal pixels can also be used to verify the contrast in the scene, to further help the focussing.

FIG. 22 shows a flowchart of a method according to an embodiment. The image is first focussed with the control loop comprising steps 301-307. The loop comprises a step 301 of resetting the pixel array; a step 302 of exposing the pixel array; a step 303 of readout of the AF pixels; a step 304 of calculating if a subject is in focus using outputs of the AF pixels. When the lens is correctly focused, the method proceeds to step 308 and the image is captured and all pixels are read out (steps 308-311). Step 308 calculates an optimal exposure time (e.g. based on metering). Step 309 resets the pixel array in preparation for exposure at step 310. The pixel array is then read out at step 311. During the focus control loop 301-307, the data from the image sensor can also be used to adjust exposure time or gain settings if required. This is known as light metering.

FIG. 23 shows a flowchart for video capture. In case of video capture, the AF pixels can be read out as part of read out of the overall video image data. Autofocus may or may not be applied during capture of the video stream. At step 321 image data is readout from the pixel array. Steps 325-328 show processing steps concerned with focussing. At step 325 the AF pixel data is extracted from the video stream and focus is calculated from this data at step 326. If it is determined at step 327 that the scene is out of focus, the lens is adjusted at step 328. Otherwise, no focus adjustment is necessary. Steps 322-324 show processing steps concerned with video image data. For some types of AF pixel (e.g. pixels 60, 70) it may be necessary to interpolate a signal value of these pixels from neighbouring pixels of the array at step 322. In case of phase assist pixels with 2 photodiodes, the data of the 2 photodiodes can be summed to get the correct pixel value for the video frame, and no interpolation is required. Further video processing steps can occur at step 323, such as data compression. Finally, (compressed) video data is stored at step 324.

Figure 24A:
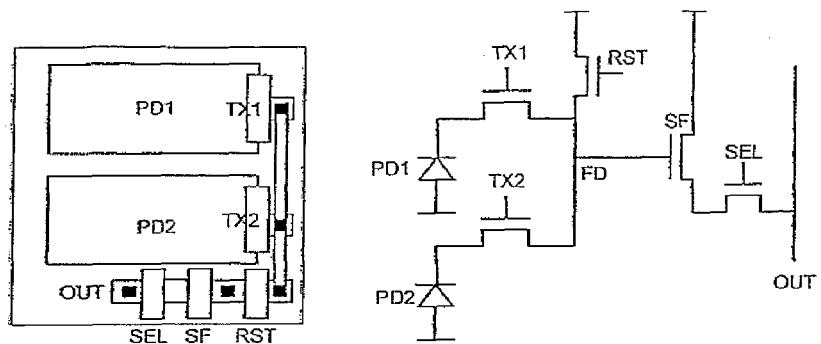
FIGS. 24A-24D show more details on a particular implementation of the two photodiodes in the pixels which only requires a single extra control line.
Figure 24B:
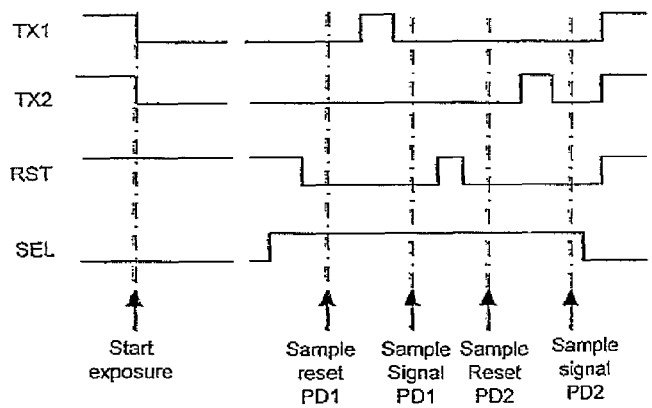
Figure 24C:
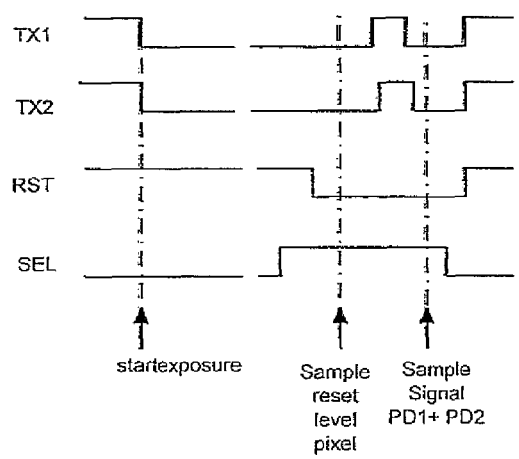

FIGS. 24A-24C show more details on a particular implementation of the two photodiodes in the pixels which only requires a single extra control line, and which does not require any circuitry to be used from neighbouring pixels. Furthermore, this implementation also allows to easily sum together the signal of the 2 photodiodes in a case when the phase autofocus data is not needed. This can be the case, when the focus has already been acquired and locked. This can also be the case, when the focus is adjusted based upon another part of the scene. The photographer or the camera processor may have decided on using only certain areas of the picture to adjust focus. This is a common control on high-end digital cameras. Referring to FIG. 24A, the pixel contains two photodiodes PD1 and PD2 which share a common floating diffusion FD. The two photodiodes PD1, PD2 are connected to this floating diffusion FD via 2 transfer gates TX1 and TX2. The floating diffusion FD is reset via a reset transistor, which is controlled via a control line RST. The pixel is read out with a source follower SF and a select transistor controlled via a control line SEL. The source follower SF puts an output signal on an output bus OUT, which is connected at a side of the pixel array to a current source.

Figure 24D:
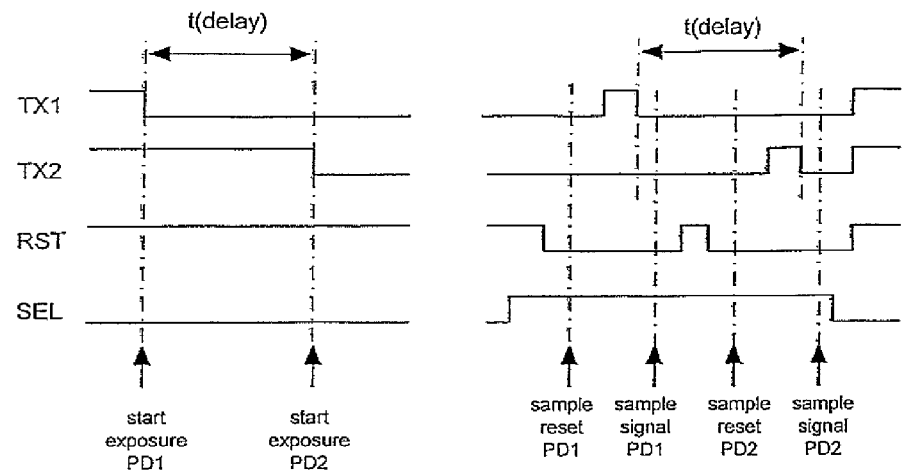

The timing and operation of the pixel for separate readout of the 2 photodiodes is shown in FIG. 24B. Before the exposure, the photodiodes are both kept in reset state by keeping TX1 and TX2 high. At the start of the exposure, both gates are set low. After readout, the select transistor is put high. Then the reset transistor is switched off. The reset level of the floating diffusion is sampled. Then TX1 is put high to transfer charges from the photodiode PD1 to the floating diffusion and the signal of PD1 can then be sampled. Then the floating diffusion is reset again, the reset level is sampled again, the charge of PD2 is transferred to the floating diffusion and the signal of PD2 is sampled. The data of both photodiodes is now available in the column amplifiers and can be read out. The operation shown in FIG. 24B can be used when the value of each photodiode PD1, PD2 is required, such as autofocus. It is also possible to delay the start of exposure in PD1 and PD2 by the same amount as the readout, to compensate for the very small time difference between readout of PD1 and PD2. This is done by delaying the falling edge of TX2 at the start of exposure, as shown in FIG. 24D.

FIG. 24C shows timing and operation when only a total signal of the two photodiodes PD1, PD2 is required, such as when the pixel is not being used for autofocus. The two transfer gates TX1, TX2 can be operated with the same timing. The charge of PD1 and PD2 is then transferred together to the floating diffusion FD and summed on the floating diffusion FD. The pixel can be read out in the same way as a standard 4-transistor pixel. This programmable operation, allowing to use the phase AF pixels either to provide the information of the two photodiodes separately, or summed together can be useful, for example, in the following use cases:

1) It can be that the focus points are selected by the camera user or by some processor in the camera. With metal light shields of the prior art, the pixels from the non-used autofocus points will have to be interpolated. In a method according to an embodiment with two photodiodes per pixel, it is possible to read out the total signal on the two photodiodes and it will contain all charges that were generated in that pixel. There is no need for re-interpolation of the AF pixels that are not used.
2) in snapshot mode, when the focus is done, and the picture is taken, then the AF pixels can be operated with the charges of PD1 and PD2 summed together. There is no need to interpolate the data of this pixel from neighbouring pixels.

Figure 25A:
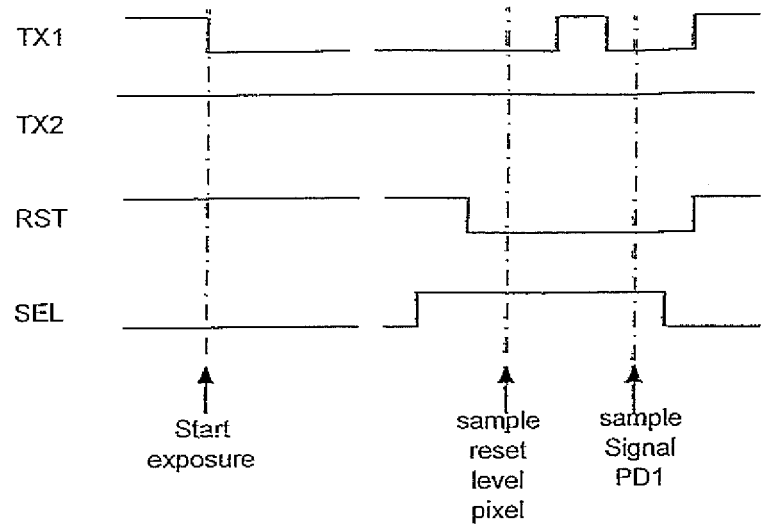
FIGS. 25A and 25B show timing used in FIG. 24.
Figure 25B:
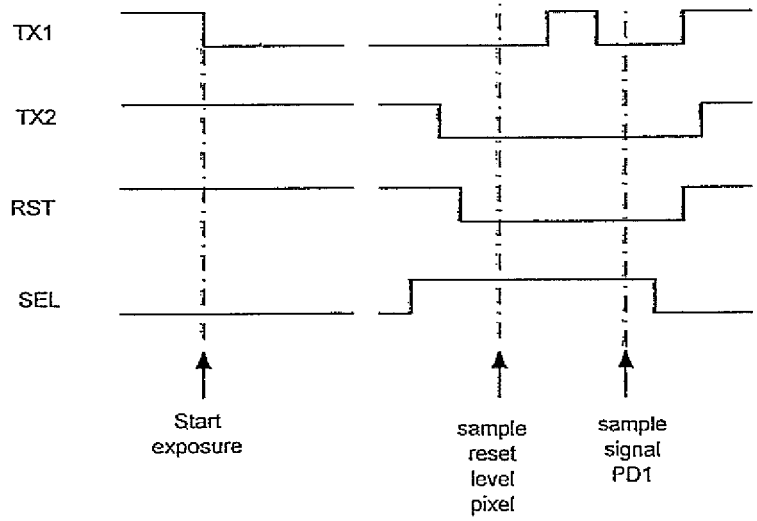

The pixel of FIG. 24 can also be operated in a mode where only one photodiode of a photodiode pair within a pixel integrates the charges, while the second photo diode is kept in a reset state. This is an alternative to connecting the second photodiode to VDD via a dedicated contact. One of the two photodiodes can be constantly kept in a reset state, such as by keeping the transfer gate connected to that photodiode high. The other photodiode is operated as a normal 4T pixel, integrating charges, and transferring to the floating diffusion after exposure for readout. This timing is shown in FIG. 25. The photodiode transfer gate TX2 may be kept high continuously (as shown in FIG. 25A) or can be switched off during readout of PD1, when TX1 is pulsed (FIG. 25B). Keeping TX2 high when RST is high will ensure that there is no charge in PD2, so there will be no charge transfer from PD2 to the floating diffusion in spite of the fact that TX2 is kept high. Such operation can be useful for certain autofocus modes of the camera. Pairs of phase detect AF pixels must then be formed again. The operation is then very similar to the first embodiment described of this invention. The additional advantage is that this operation is switchable by the timing of the pixel, while a pixel 60, 70 where one of the two photo diodes is permanently connected to a high potential has a fixed configuration.

Figure 26:
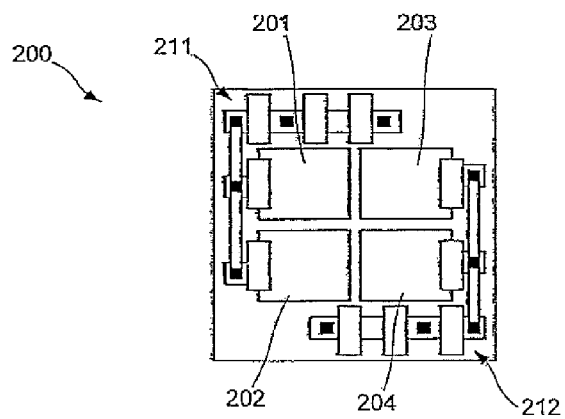
FIG. 26 shows a pixel with four photo diodes.

Although embodiments have been described primarily with examples using two photodiodes, FIG. 26 shows a pixel 200 with four photodiodes 201-204. This can have some advantages for some lens systems, or for large pixels. The pixel 200 is shown with two sets of shared readout circuitry 211, 212. Readout circuitry 211 is shared by photodiodes 201, 202 and readout circuitry 212 is shared by photodiodes 203, 204. It will be appreciated that readout circuitry can be provided in any of the ways described above, such as dedicated readout circuitry per photodiode, or readout circuitry shared with a neighbouring (non-AF) pixel in the array.

Figure 27:
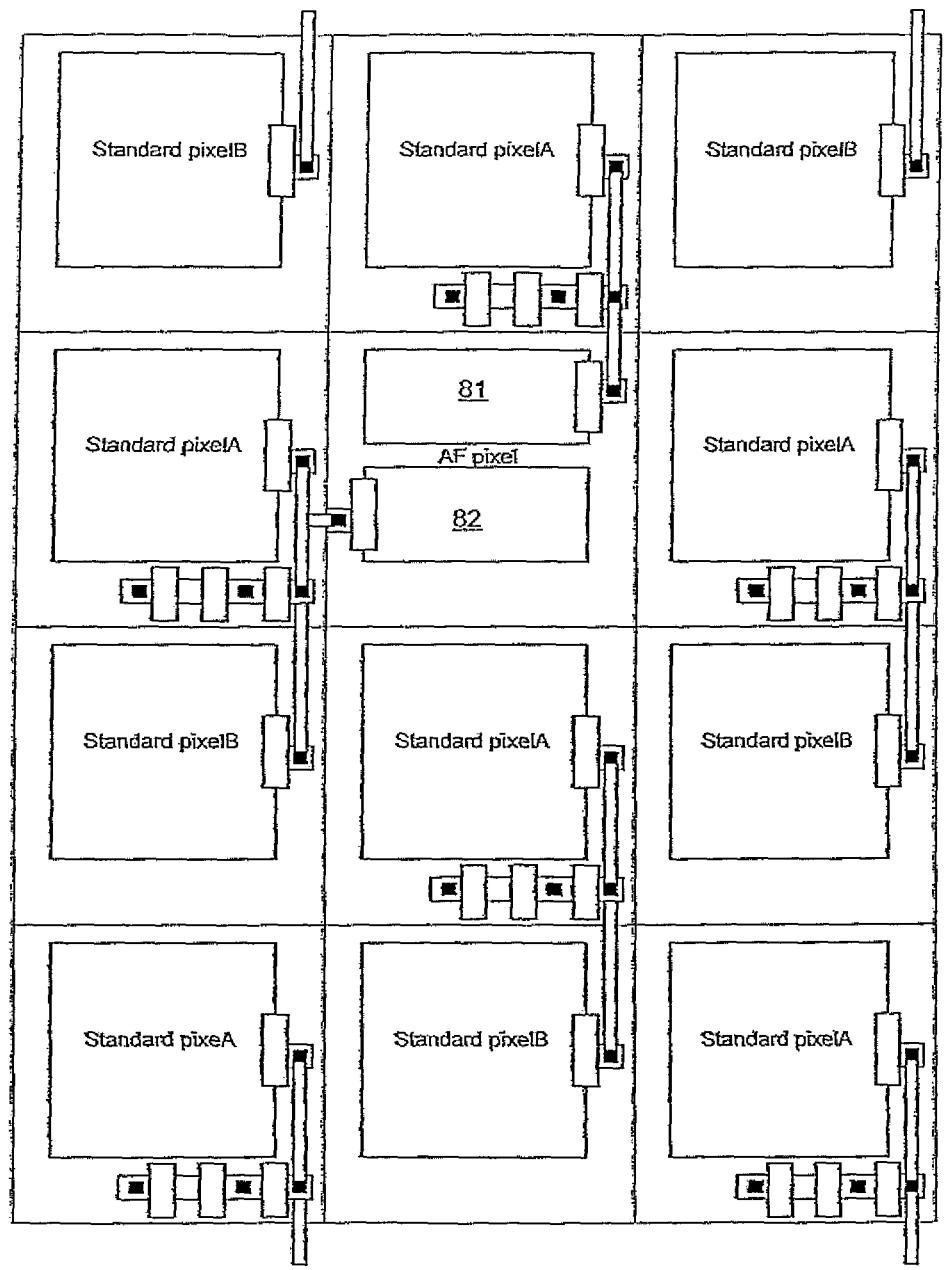
FIG. 27 shows an example of phase AF pixels embedded in a staggered two-shared pixel array.
Figure 29:
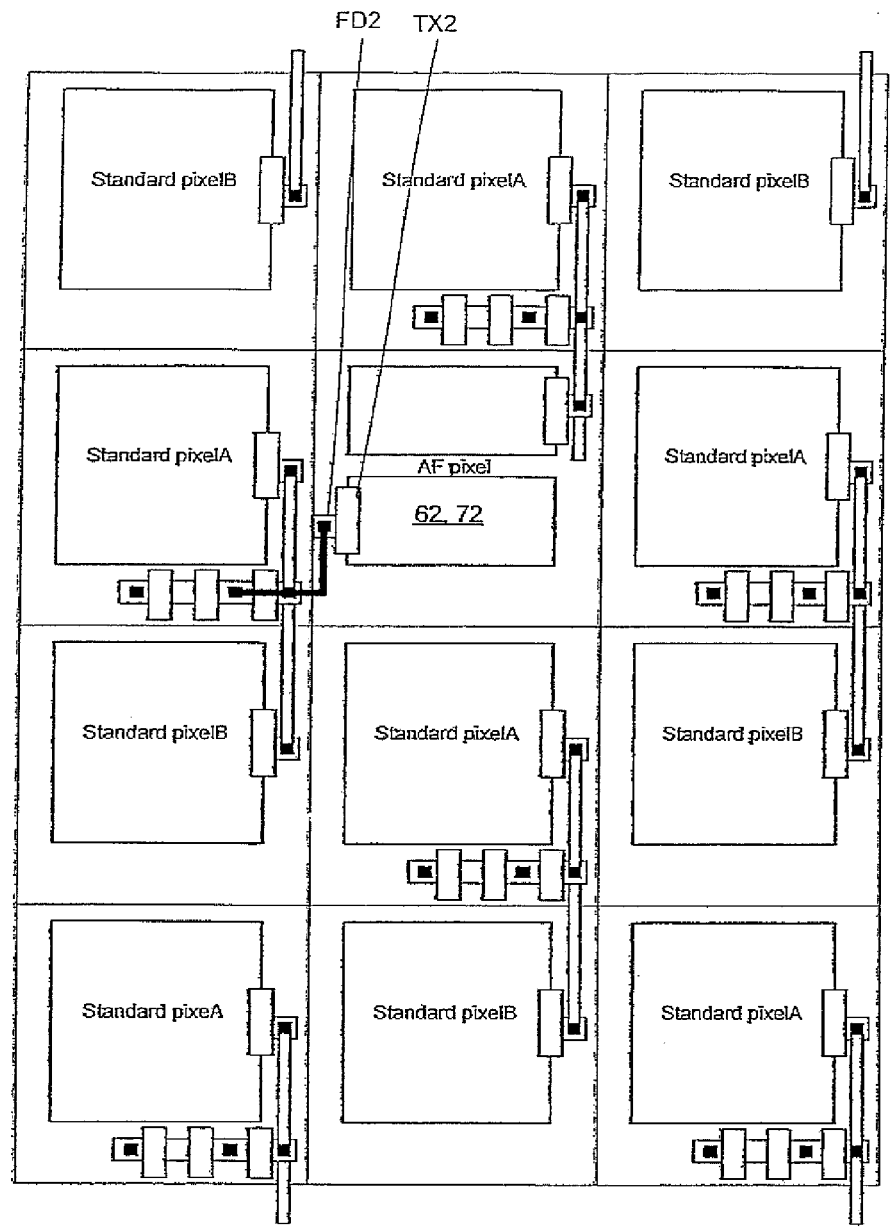
FIG. 29 shows an example of phase AF pixels embedded in a staggered two-shared pixel array where one of the photodiodes in the AF pixel is not readable.

FIG. 27 shows an example of how such phase AF pixels can be embedded in a staggered 2-shared pixel array. A staggered shared 2-pixel array is described for example in US Patent Application US2010/0148037A1. Shared pixels use common readout circuits between neighbouring pixels, to save area in the pixels that would be needed for dedicated per-pixel readout circuits. A staggered configuration is more symmetric and therefore preferred. FIG. 27 shows an example of a staggered 2-shared pixel array using AF pixels with two readable photodiodes. This AF pixel needs two floating diffusions, which can be taken from neighbouring pixels as shown in FIG. 27. The top photodiode 81 of the AF pixel uses the floating diffusion of the pixel above the AF pixel. This is also the pixel with which a standard pixel at that location would share its floating diffusion. The bottom photodiode 82 uses the floating diffusion of the left-side neighbour pixel pair. A staggered 2-shared pixel array can also comprise AF pixels with only one readable photodiode, such as those pixels shown in FIGS. 8A-8C. An example is shown in FIG. 29. The dummy photodiode 62, 72, has a dummy transfer gate TX2 and a dummy floating diffusion FD2 associated with it. The dummy floating diffusion FD2 is connected to VDD via a connection (shown in bold) on a separate routing layer.

Figure 30:
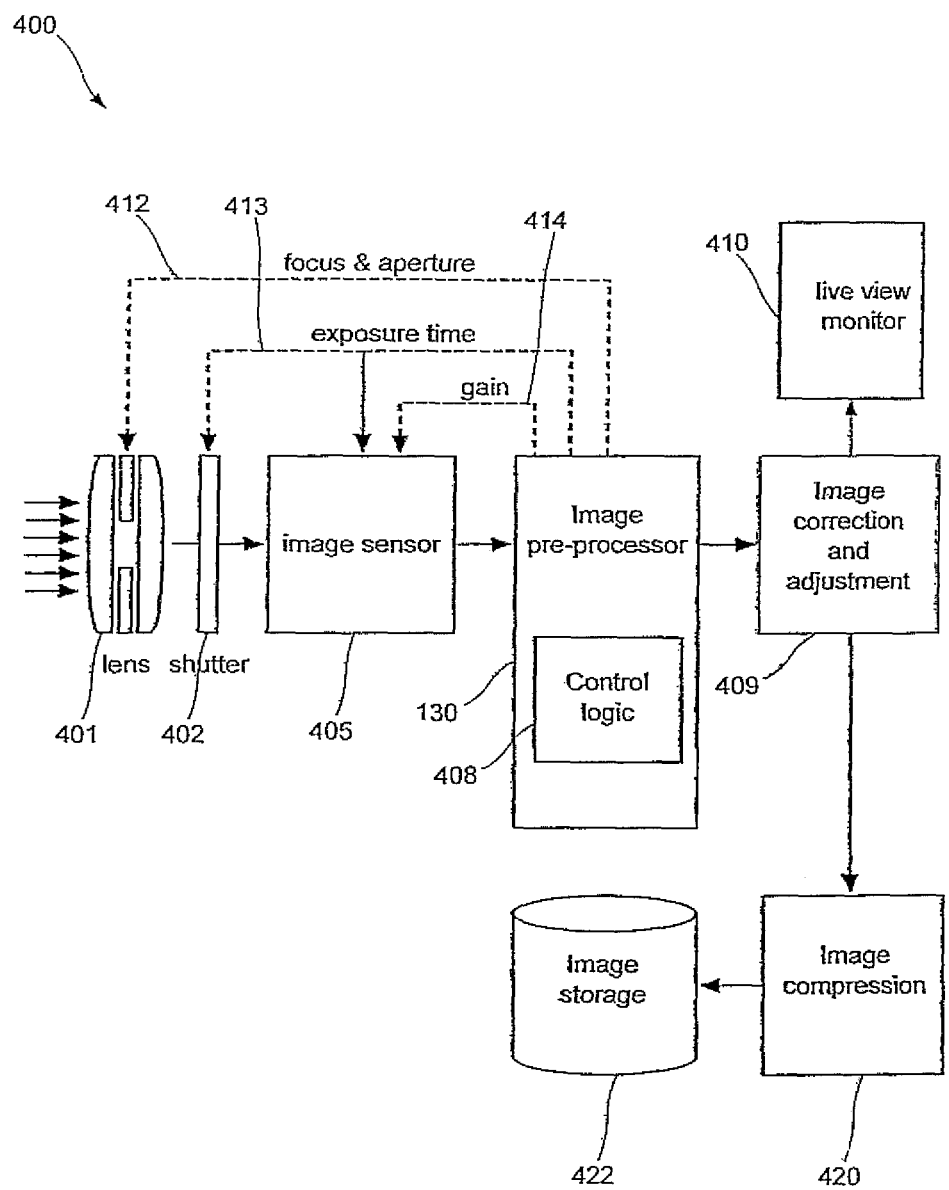
FIG. 30 shows a camera system that can use the phase detect autofocus pixels.

FIG. 30 shows a camera system 400 that can use the phase detect autofocus pixels. An image sensor 405 comprises a pixel array as previously described and shown in FIG. 19. The optical front-end of the camera comprises a lens 401 which is capable of autofocussing, such as by a motor which drives one or more elements of the lens 401 in response to a control input 412. Image sensor 405 can be of the form described earlier and shown in FIG. 19. A shutter 402 can also be provided. The information of the phase detect autofocus pixels is captured by the image sensor 405, along with the normal image. The image pre-processor 130 extracts the focus and exposure information and feeds this back to the image sensor 405, the lens 401 and the shutter 402. The exposure time is sent 413 to the shutter (if present) or the image sensor (in case of electronic shutter operation). Gain settings are fed back 414 to the image sensor. Focus information, extracted from the phase detect AF pixels is fed back 412 to the lens. The image correction and adjustments are performed in the image processor 409. The image is then sent to a monitor 410 for live view, and can also be sent to a compression unit 420 and to storage 422, such as a memory.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to an item refers to one or more of those items. The term "comprising" is used herein to mean including the method blocks or elements identified, but that such blocks or elements do not comprise an exclusive list and a method or apparatus may contain additional blocks or elements.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. Although various embodiments have been described above with a certain degree of particularity, or with reference to one or more individual embodiments, those skilled in the art could make numerous alterations to the disclosed embodiments without departing from the invention.

The invention claimed is:

1. A pixel array for imaging comprising an array of pixels of a first pixel type and a second pixel type, wherein:
   each pixel of the first pixel type comprises a first photo-sensitive element having a first area;
   each pixel of the second pixel type comprises a second photo-sensitive element having a second area, which is smaller than the first area, and a third photo-sensitive element, wherein only the second photo-sensitive element in the pixel of the second pixel type is connected to a readout circuit, and wherein the third photo-sensitive element is connected to a charge drain via one of a permanent connection and a switchable connection.

2. A pixel array according to claim 1 wherein the switchable connection comprises a transfer gate.

3. A pixel array according to claim 1 wherein the switchable connection comprises a transfer gate, a reset switch and a floating diffusion between the transfer gate and the reset switch.

4. A pixel array according to claim 1 comprising isolation between the second photo-sensitive element and the third photo-sensitive element.

5. A pixel array according to claim 1 wherein the isolation between the second photo-sensitive element and the third photo-sensitive element comprises one of:
   shallow trench isolation between the second photo-sensitive element and the third photo-sensitive element;
   a p type implant between the second photo-sensitive element and the third photo-sensitive element;
   a p+ implant located between the second photo-sensitive element and the third photo-sensitive element.

6. A pixel array according to claim 1 wherein the pixel array is a regular array of equally sized pixels and the first pixel type and the second pixel type have the same size.

7. A pixel array according to claim 1 further comprising a microlens positioned above each of the pixels, wherein each pixel of the first pixel type has a single microlens positioned above the first photo-sensitive element and each pixel of the second pixel type has a single microlens positioned above a combination of the second photo-sensitive element and the third photo-sensitive element.

8. A pixel array according to claim 1 further comprising at least one of:
   the second photo-sensitive element and the third photo-sensitive element are of substantially equal area;
   the second photo-sensitive element and the third photo-sensitive element are of substantially equal shape.

9. A pixel array according to claim 8 wherein each pixel of the second type has a configuration which is selected from: a first configuration which has a vertical division of the pixel into two photo-sensitive elements; a second configuration which has a horizontal division of the pixel into two photo-sensitive elements; a third configuration which has a diagonal division of the pixel into two photo-sensitive elements.

10. A pixel array according to claim 9 wherein the pixels of the second type comprise a combination of at least two of the first configuration, the second configuration and the third configuration.

11. A pixel array according to claim 1 wherein pixels of the second pixel type are provided in pairs in the array, and the second photo-sensitive element of one pixel in the pair is positioned on a different side of the pixel compared to the second photo-sensitive element of the other pixel in the pair.

12. A pixel array according to claim 1 wherein shared readout circuitry is provided for a pixel of the first pixel type and a pixel of the second pixel type and the shared readout circuitry is arranged to selectively read out a signal from the first photo-sensitive element and the second photo-sensitive element.

13. Imaging apparatus comprising a pixel array according to claim 1.

14. Imaging apparatus according to claim 13 further comprising control logic which is arranged to determine focus of an imaged object using at least two signal values read from at least two pixels of the second pixel type.

15. A method of operating a pixel array for imaging comprising:
providing an array of pixels of a first pixel type and a second pixel type, wherein each pixel of the first pixel type comprises a first photo-sensitive element having a first area, each pixel of the second pixel type comprises a second photo-sensitive element having a second area, which is smaller than the first area, and a third photo-sensitive element, wherein only the second photo-sensitive element in the pixel of the second pixel type is connected to a readout circuit, and wherein the third photo-sensitive element is connected to a charge drain via one of a permanent connection and a switchable connection;
using the readout circuit to read the second photo-sensitive element;
draining charges from the third photo-sensitive element without reading a signal value from the third photo-sensitive element.

16. A method according to claim 15 wherein the switchable connection comprises a transfer gate, the method further comprising operating the transfer gate continuously.

17. A method according to claim 15 wherein the switchable connection comprises a transfer gate, the method further comprising switching off the transfer gate during readout of the second photo-sensitive element.

18. A method according to claim 15 wherein the switchable connection comprises a transfer gate and wherein the second photo-sensitive element is connected to the readout circuit via a further transfer gate, the method further comprising operating the transfer gate and the further transfer gate in the same manner.

19. A method according to claim 15 further comprising:
determining focus of an imaged object using at least two signal values read from at least two pixels of the second pixel type.

* * * * *